(12) United States Patent
Oh

(10) Patent No.: US 12,382,821 B2
(45) Date of Patent: Aug. 5, 2025

(54) DISPLAY WITH OXIDE SEMICONDUCTOR SUBSTRATE AND LLO PROTECTION

(71) Applicant: LG Display Co., Ltd., Seoul (KR)

(72) Inventor: Yeonjun Oh, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 476 days.

(21) Appl. No.: 17/968,754

(22) Filed: Oct. 18, 2022

(65) Prior Publication Data
US 2023/0217799 A1  Jul. 6, 2023

(30) Foreign Application Priority Data

Dec. 30, 2021 (KR) .................. 10-2021-0192836

(51) Int. Cl.
*H10K 77/10* (2023.01)
*B32B 3/26* (2006.01)
(Continued)

(52) U.S. Cl.
CPC ............ *H10K 77/111* (2023.02); *B32B 3/266* (2013.01); *H10K 59/123* (2023.02); *H10K 59/124* (2023.02); *B32B 9/04* (2013.01); *B32B 9/045* (2013.01); *B32B 27/281* (2013.01); *B32B 27/308* (2013.01); *B32B 2307/202* (2013.01); *B32B 2307/206* (2013.01); *B32B 2307/412* (2013.01); *B32B 2307/42* (2013.01); *B32B 2307/71* (2013.01); *B32B 2307/7244* (2013.01); *B32B 2307/7246* (2013.01); *B32B 2457/206* (2013.01); *H10K 2102/311* (2023.02)

(58) Field of Classification Search
CPC .. H10K 77/111; H10K 59/123; H10K 59/124; H10K 2102/311; H10K 50/81; H10K 59/121; B32B 3/266; B32B 9/04; B32B 9/045; B32B 27/281; B32B 27/308; B32B 2307/202; B32B 2307/206; B32B 2307/412; B32B 2307/42; B32B 2307/71; B32B 2307/7244; B32B 2307/7246; B32B 2457/206; B32B 3/12; B32B 2457/20

See application file for complete search history.

(56) References Cited

U.S. PATENT DOCUMENTS 9,178,177 B2   11/2015  Yamazaki et al.
2016/0197293 A1*  7/2016  Chen .................. H10K 50/856
                                                      257/40
(Continued)

FOREIGN PATENT DOCUMENTS

KR   10-2019-0054354 A   5/2019
KR   10-2020-0082753 A   7/2020

*Primary Examiner* — J. E. Schoenholtz
(74) *Attorney, Agent, or Firm* — Fenwick & West LLP

(57) ABSTRACT

Provided is a display device. The display device having an active area including a plurality of sub-pixels and a non-active area. The display device comprises a lower substrate made of a transparent conducting oxide or an oxide semiconductor; a plurality of transistors disposed in the plurality of sub-pixels on the lower substrate, a planarization layer disposed on the plurality of transistors, a plurality of light emitting elements disposed on the planarization layer in the plurality of sub-pixels and including an anode, a light emitting layer and a cathode and a plurality of light emitting layer protective patterns disposed between the planarization layer and the anode.

20 Claims, 11 Drawing Sheets

(51) Int. Cl.
*B32B 9/04* (2006.01)
*B32B 27/28* (2006.01)
*B32B 27/30* (2006.01)
*H10K 59/123* (2023.01)
*H10K 59/124* (2023.01)
*H10K 102/00* (2023.01)

(56) References Cited

U.S. PATENT DOCUMENTS

| | | | |
|---|---|---|---|
| 2017/0222192 A1* | 8/2017 | You | H10K 50/844 |
| 2020/0212331 A1 | 7/2020 | Lee | |
| 2020/0235321 A1* | 7/2020 | Li | H10K 59/873 |
| 2023/0074967 A1* | 3/2023 | Lee | B32B 3/30 |
| 2023/0209978 A1* | 6/2023 | Kim | H10K 59/351 |
| | | | 257/40 |

* cited by examiner

DISPLAY WITH OXIDE SEMICONDUCTOR SUBSTRATE AND LLO PROTECTION

CROSS-REFERENCE TO RELATED APPLICATIONS

This application claims the priority of Korean Patent Application No. 10-2021-0192836 filed on Dec. 30, 2021, in the Korean Intellectual Property Office, the disclosure of which is incorporated herein by reference.

BACKGROUND

Field

The present disclosure relates to a display device and more particularly, to a display device in which damage to a light emitting layer during a laser lift off (LLO) process can be minimized.

Description of the Related Art

Display devices used for a computer monitor, a TV, a mobile phone, and other applications include an organic light emitting display (OLED) that emits light by itself and a liquid crystal display (LCD) that requires a separate light source.

As display devices are applied to increasingly diverse fields, such as a computer monitor, a TV, and a personal mobile device, display devices having a large display area and a reduced volume and weight have been studied.

Recently, a flexible display device in which display elements and wiring lines are formed on a flexible substrate made of flexible plastic and which can display an image even when folded or rolled has attracted attention as a next-generation display device.

SUMMARY

An object to be achieved by the present disclosure is to provide a display device including a very thin substrate made by using one of a transparent conducting oxide layer and an oxide semiconductor layer instead of a plastic substrate.

Another object to be achieved by the present disclosure is to provide a display device that minimizes permeation of moisture and oxygen.

Yet another object to be achieved by the present disclosure is to provide a display device from which a plastic substrate is removed, which can simplify a manufacturing process and reduce manufacturing costs.

Still another object to be achieved by the present disclosure is to provide a display device in which damage to a light emitting layer caused by a laser beam during an LLO process can be suppressed.

Still another object to be achieved by the present disclosure is to provide a display device in which holes can be smoothly supplied even when an anode is cracked or damaged during an LLO process.

Objects of the present disclosure are not limited to the above-mentioned objects, and other objects, which are not mentioned above, can be clearly understood by those skilled in the art from the following descriptions.

According to an aspect of the present invention, display device having an active area including a plurality of sub-pixels and a non-active area, the display device comprising: a substrate made of a transparent conducting oxide or an oxide semiconductor; a plurality of transistors disposed in the plurality of sub-pixels on the substrate; a planarization layer disposed on the plurality of transistors; a plurality of light emitting elements disposed on the planarization layer in the plurality of sub-pixels; and a plurality of light emitting layer protective patterns disposed between the planarization layer and an anode of at least one of the light emitting elements, the light emitting layer protective patterns including photosensitive material.

According to an aspect of the present disclosure, there is provided a display device having an active area including a plurality of sub-pixels and a non-active area. The display device comprises a lower substrate made of a transparent conducting oxide or an oxide semiconductor, a plurality of transistors disposed in the plurality of sub-pixels on the lower substrate, a planarization layer disposed on the plurality of transistors, a plurality of light emitting elements disposed on the planarization layer in the plurality of sub-pixels and including an anode, a light emitting layer and a cathode and a plurality of light emitting layer protective patterns disposed between the planarization layer and the anode.

Other detailed matters of the exemplary embodiments are included in the detailed description and the drawings.

According to the present disclosure, a transparent conducting oxide layer and an oxide semiconductor layer are used as a substrate of a display device. Thus, it is possible to easily control permeation of moisture.

According to the present disclosure, a transparent conducting oxide layer and an oxide semiconductor layer in the form of a thin film are used as a substrate of a display device. Thus, it is possible to improve flexibility of the display device.

According to the present disclosure, a transparent conducting oxide layer and an oxide semiconductor layer in the form of a thin film are used as a substrate of a display device. Thus, it is possible to relieve stress generated when the display device is bent or rolled and also possible to reduce a crack of the display device.

According to the present disclosure, a transparent conducting oxide layer and an oxide semiconductor layer are used as a substrate of a display device. Thus, it is possible to simplify a structure of the display device and reduce manufacturing costs.

According to the present disclosure, a transparent conducting oxide layer and an oxide semiconductor layer are used as a substrate of a display device. Thus, it is possible to reduce the generation of static electricity in the substrate and improve the display quality.

According to the present disclosure, a substrate of a display device can be manufactured by a deposition process in a vacuum environment. Thus, it is possible to reduce the time required for manufacturing the substrate. Also, it is possible to minimize the formation of foreign materials on the substrate and defects caused by the foreign materials.

According to the present disclosure, it is possible to suppress damage to a light emitting layer caused by a laser beam irradiated during an LLO process and thus possible to suppress the occurrence of a driving error caused by the damage.

According to the present disclosure, it is possible to minimize a problem with supply of holes caused by an increase in resistance of an anode when the anode is cracked or damaged by a laser beam irradiated during an LLO process.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
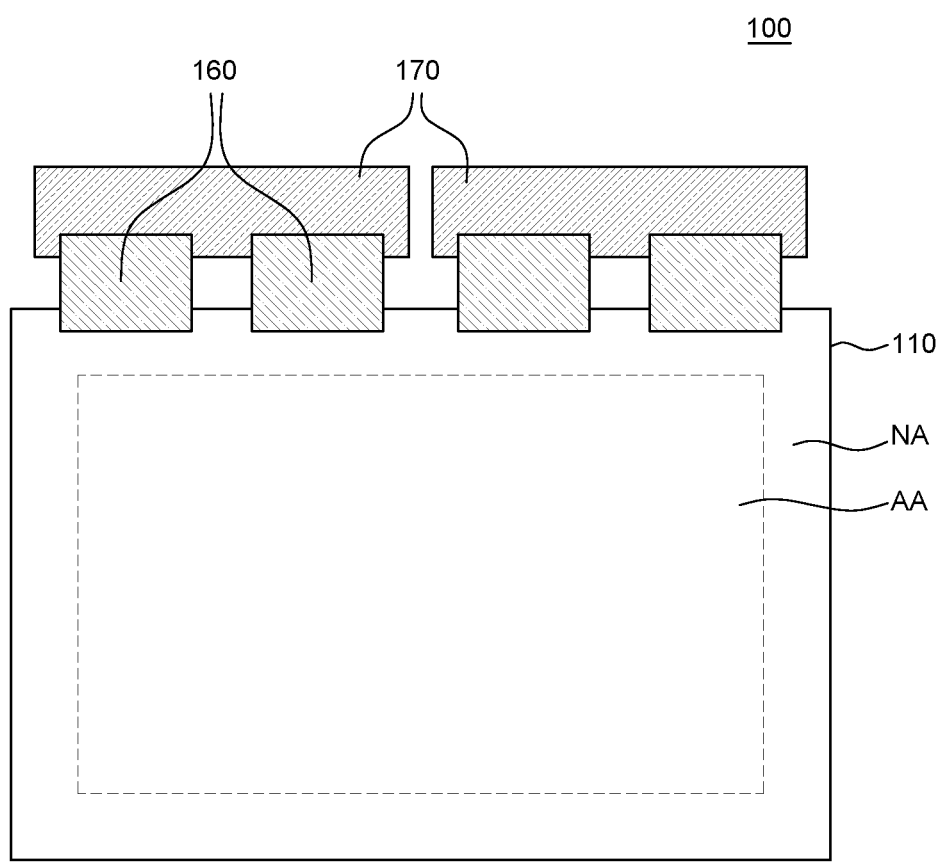
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a plan view of a display device according to an exemplary embodiment of the present disclosure. For the convenience of description, FIG. 1 illustrates only a lower substrate 110, a plurality of flexible films 160 and a plurality of printed circuit boards 170 among various components of a display device 100.

Referring to FIG. 1, the lower substrate 110 is a support member configured to support the other components of the display device 100. The lower substrate 110 may be made of any one of transparent conducting oxides and oxide semiconductors. For example, the lower substrate 110 may be made of transparent conducting oxides (TCOs) such as indium tin oxide (ITO), indium zinc oxide (IZO), indium zinc tin oxide (ITZO), etc.

Alternatively, the lower substrate 110 may be made of oxide semiconductor materials including indium (In) and gallium (Ga). For example, the lower substrate 110 may be made of transparent oxide semiconductors such as indium gallium zinc oxide (IGZO), indium gallium oxide (IGO), indium tin zinc oxide (ITZO), etc. However, the types of transparent conducting oxides and oxide semiconductors are just examples. The lower substrate 110 may be made of other transparent conducting oxides and oxide semiconductor materials which are not described in the present disclosure, but is not limited thereto.

Meanwhile, the lower substrate 110 may be formed by depositing a transparent conducting oxide or an oxide semiconductor to a very small thickness. Since the lower substrate 110 is formed to a very small thickness, it can have flexibility. Also, the display device 100 including the lower substrate 110 having flexibility can be implemented as a flexible display device 100 that can display an image even when folded or rolled. For example, if the display device 100 is a foldable display device, the lower substrate 110 can be folded or unfolded around a folding axis. For another example, if the display device 100 is a rollable display device, the display can be rolled around a roller for storage. Therefore, the display device 100 according to an exemplary embodiment of the present disclosure can be implemented as a flexible display device 100, such as a foldable display device or a rollable display device, by using the lower substrate 110 having flexibility.

Also, the display device 100 according to an exemplary embodiment of the present disclosure can be subjected to an LLO process by using the lower substrate 110 made of a transparent conducting oxide or an oxide semiconductor. The LLO process refers to a process of separating the lower substrate 110 from a temporary substrate under the lower substrate 110 by using a laser beam while the display device 100 is manufactured. Since the lower substrate 110 is a layer provided for an easier LLO process, it may also be referred to as a functional thin film, a functional thin film layer, a functional substrate, etc. The LLO process will be described in more detail later.

The display device 100 includes an active area AA and a non-active area NA.

The active area AA refers to an area where an image is displayed. In the active area AA, a pixel unit comprised of a plurality of sub-pixels may be disposed to display an image. For example, the pixel unit may be comprised of a plurality of sub-pixels each including a light emitting element and a driving circuit to display an image.

The non-active area NA refers to an area where an image is not displayed and various lines and driver ICs for driving the sub-pixels disposed in the active area AA are disposed. For example, in the non-active area NA, various driver ICs such as a gate driver IC and a data driver IC may be disposed.

The plurality of flexible films 160 are disposed on one end of the lower substrate 110. The plurality of flexible films 160 are electrically connected to the one end of the lower substrate 110. The plurality of flexible films 160 include various components disposed on a base film having malleability and serve to supply signals to the plurality of sub-pixels disposed in the active area AA. One ends of the plurality of flexible films 160 may be disposed in the non-active area NA to supply a data voltage or the like to the plurality of sub-pixels disposed in the active area AA. FIG. 1 illustrates four flexible films 160. However, the number of flexible films 160 are not limited thereto and may vary depending on the design.

Meanwhile, driver ICs such as a gate driver IC and a data driver IC may be disposed on the plurality of flexible films 160. The driver ICs may be configured to process data for displaying an image and a driving signal for processing the data. The driver ICs may be mounted in a Chip On Glass (COG) method, a Chip On Film (COF) method, a Tape Carrier Package (TCP) or the like. For the convenience of description, the driver ICs are described as being mounted on the plurality of flexible films 160 in the COF method, but the present disclosure is not limited thereto.

The printed circuit board 170 is connected to the plurality of flexible films 160. The printed circuit board 170 is configured to supply signals to the driver ICs. Various components for supplying various signals, such as a drive signal and a data voltage, to the driver ICs may be disposed on the printed circuit board 170. FIG. 1 illustrates two printed circuit boards 170. However, the number of printed circuit boards 170 is not limited thereto and may vary depending on the design.

The pixel unit may be disposed in the active area AA as described above. The pixel unit is a component including a plurality of sub-pixels and configured to display an image. The plurality of sub-pixels of the pixel unit may represent a minimum unit of the active area AA, and a light emitting element and a driving circuit may be disposed in each of the plurality of sub-pixels. For example, the light emitting element in each of the plurality of sub-pixels may include an organic light emitting element comprised of an anode, an organic light emitting layer. Also, the light emitting element in each of the plurality of sub-pixels may include an LED comprised of N-type and P-type semiconductor layers and a light emitting layer, but is not limited thereto. The driving circuit for driving the plurality of sub-pixels may include driving elements such as a thin film transistor, a storage capacitor and the like, but is not limited thereto. Hereafter, for the convenience of description, the light emitting element in each of the plurality of sub-pixels will be assumed as an organic light emitting element, but is not limited thereto.

Meanwhile, the display device 100 may be of a top emission type or a bottom emission type depending on an emission direction of light emitted from the light emitting element.

In the top emission type, light emitted from the light emitting element may be emitted toward an upper portion of the lower substrate 110 on which the light emitting element is disposed. If the display device 100 is of the top emission type, a reflective layer may be formed under the anode. This is to allow light emitted from the light emitting element to travel to the upper portion of the lower substrate 110, i.e., toward the cathode.

In the bottom emission type, light emitted from the light emitting element is emitted toward a lower portion of the lower substrate 110 on which the light emitting element is disposed. If the display device 100 is of the bottom emission type, the anode may be made of a transparent conductive material only and the cathode may be made of a metal material having high reflectivity. This is to allow light emitted from the light emitting element to travel to the lower portion of the lower substrate 110.

Hereafter, for the convenience of description, the display device 100 according to an exemplary embodiment of the present disclosure will be described as a bottom emission type display device, but is not limited thereto.

An encapsulation layer may be disposed to cover the pixel unit. The encapsulation layer may seal the pixel unit to protect the light emitting elements of the pixel unit from external moisture, oxygen and impacts. The encapsulation layer may be configured as a thin film encapsulation (TFE) formed by alternately laminating a plurality of inorganic layers and a plurality of organic layers. For example, the inorganic layers may be made of an inorganic material, such as silicon nitride (SiNx), silicon oxide (SiOx) and aluminum oxide (AlOx), and the organic layers may be made of epoxy or acrylic polymer, but are not limited thereto. Alternatively, the encapsulation layer may be configured as a face seal. For example, the encapsulation layer may be formed by forming a UV or thermally curable sealant on the entire surface of the pixel unit. However, the encapsulation layer may have various structures and may be made of various materials, and is not limited thereto.

Meanwhile, an encapsulation substrate made of a metal material having a high modulus and a high corrosion resistance may be further disposed on the encapsulation layer. For example, the encapsulation substrate may be made of a material having a high modulus of from about 200 MPa to about 900 MPa. The encapsulation substrate may be made of a metal material that has a high corrosion resistance and can be easily processed into foil or a thin film. Examples of the metal material may include aluminum (Al), nickel (Ni), chromium (Cr), and an alloy of iron (Fe) and Ni. Since the encapsulation substrate is made of a metal material, the encapsulation substrate can be implemented in the form of an ultra-thin film and can provide a high resistance to external impacts and scratches.

A sealing member may be disposed to surround side surfaces of the pixel unit and the encapsulation layer. The sealing member is disposed in the non-active area NA to surround the pixel unit disposed in the active area AA. The sealing member is disposed to surround a side surface of the pixel unit and a side surface of the encapsulation layer. Thus, the sealing member can minimize permeation of moisture into the pixel unit.

The sealing member may be made of a non-conductive material having elasticity to seal the side surface of the pixel unit and reinforce the rigidity of a side surface of the display device 100. Also, the sealing member may be made of a material having adhesiveness. Further, the sealing member may contain a moisture absorbent that absorbs moisture and oxygen from the outside to minimize permeation of moisture through a side portion of the display device 100. For example, the sealing member may be made of polyimide (PI), poly urethane, epoxy and acrylic material, but is not limited thereto.

Hereafter, the plurality of sub-pixels of the pixel unit will be described in more detail with reference to FIG. 2 together.

Figure 2:
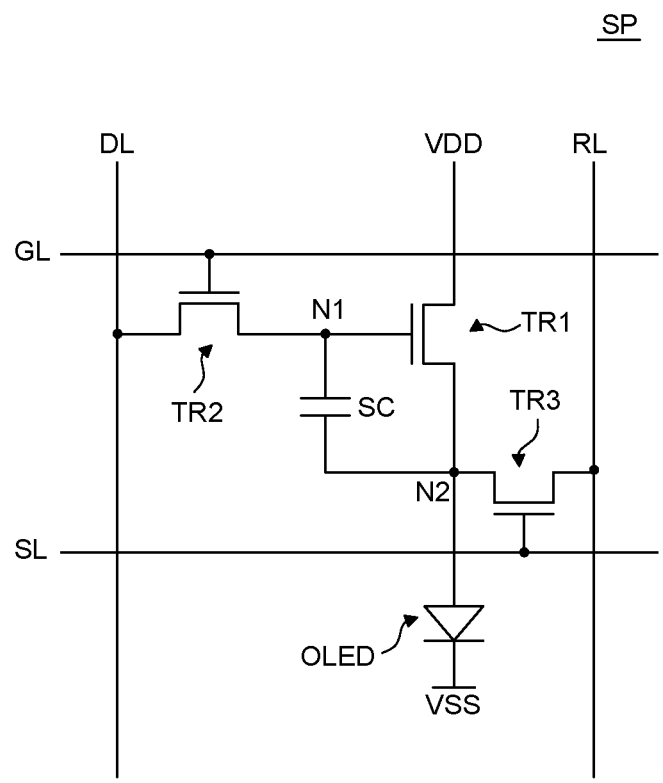
FIG. 2 is a circuit diagram of a sub-pixel of the display device according to an exemplary embodiment of the present disclosure.

FIG. 2 is a circuit diagram of a sub-pixel of the display device according to an exemplary embodiment of the present disclosure.

Referring to FIG. 2, a driving circuit for driving a light emitting element OLED in each of a plurality of sub-pixels SP includes a first transistor TR1, a second transistor TR2, a third transistor TR3 and a storage capacitor SC. Further, a plurality of lines including a gate line GL, a data line DL, a high potential power line VDD, a sensing line SL and a reference line RL may be disposed on the lower substrate 110 to drive the driving circuit.

Each of the first transistor TR1, the second transistor TR2 and the third transistor TR3 included in the driving circuit in each sub-pixel SP includes a gate electrode, a source electrode, and a drain electrode.

The first transistor TR1, the second transistor TR2 and the third transistor TR3 may be a P-type thin film transistor or an N-type thin film transistor. For example, in the P-type thin film transistor, holes flow from a source electrode to a drain electrode, and, thus, current can flow from the source electrode to the drain electrode. In the N-type thin film transistor, electrons flow from a source electrode to a drain electrode, and, thus, currents can flow the drain electrode to the source electrode. Hereafter, the first transistor TR1, the second transistor TR2 and the third transistor TR3 will be described as N-type thin film transistors in which current flow from a drain electrode to a source electrode, but are not limited thereto.

The first transistor TR1 includes a first active layer, a first gate electrode, a first source electrode and a first drain electrode. The first gate electrode is connected to a first node N1, the first source electrode is connected to an anode of the light emitting element OLED, and the first drain electrode is connected to the high potential power line VDD. When a voltage of the first node N1 is higher than a threshold voltage, the first transistor TR1 may be turned on. When the voltage of the first node N1 is lower than the threshold voltage, the first transistor TR1 may be turned off. When the first transistor TR1 is turned on, a driving current may be transmitted to the light emitting element OLED through the first transistor TR1. Accordingly, the first transistor TR1 that controls the driving current transmitted to the light emitting element OLED may also be referred to as a driving transistor.

The second transistor TR2 includes a second active layer, a second gate electrode, a second source electrode and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, the first node N1 may be charged with a data voltage from the data line DL. Accordingly, the second transistor TR2 that is turned on or off by the gate line GL may also be referred to as a switching transistor.

The third transistor TR3 includes a third active layer, a third gate electrode, a third source electrode and a third drain electrode. The third gate electrode is connected to the sensing line SL, the third source electrode is connected to a second node N2, and the third drain electrode is connected to a reference line RL. The third transistor TR3 may be turned on or off based on a sensing voltage from the sensing line SL. When the third transistor TR3 is turned on, the third transistor TR3 may transmit a reference voltage from the reference line RL to the second node N2 and the storage capacitor SC. Accordingly, the third transistor TR3 may also be referred to as a sensing transistor.

Meanwhile, FIG. 2 illustrates that the gate line GL and the sensing line SL are separate lines, but the gate line GL and the sensing line SL may be implemented as a single line. However, the present disclosure is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting element OLED emits light. Thus, a constant driving current can be supplied to the light emitting element OLED. The storage capacitor SC includes a plurality of capacitor electrodes. For example, one of the plurality of capacitor electrodes may be connected to the first node N1 and another one of the plurality of capacitor electrodes may be connected to the second node N2.

The light emitting element OLED includes an anode, a light emitting layer, and a cathode. The anode of the light emitting element OLED is connected to the second node N2 and the cathode is connected to a low potential power line VSS. The light emitting element OLED may be supplied with a driving current from the first transistor TR1 to emit light.

Meanwhile, FIG. 2 illustrates that the driving circuit of the sub-pixel SP of the display device 100 according to an exemplary embodiment of the present disclosure has a 3T1C structure including three transistors and a storage capacitor SC. However, the number and a connection relationship of transistors and storage capacitors SC are not limited thereto and may vary depending on the design.

Figure 3:
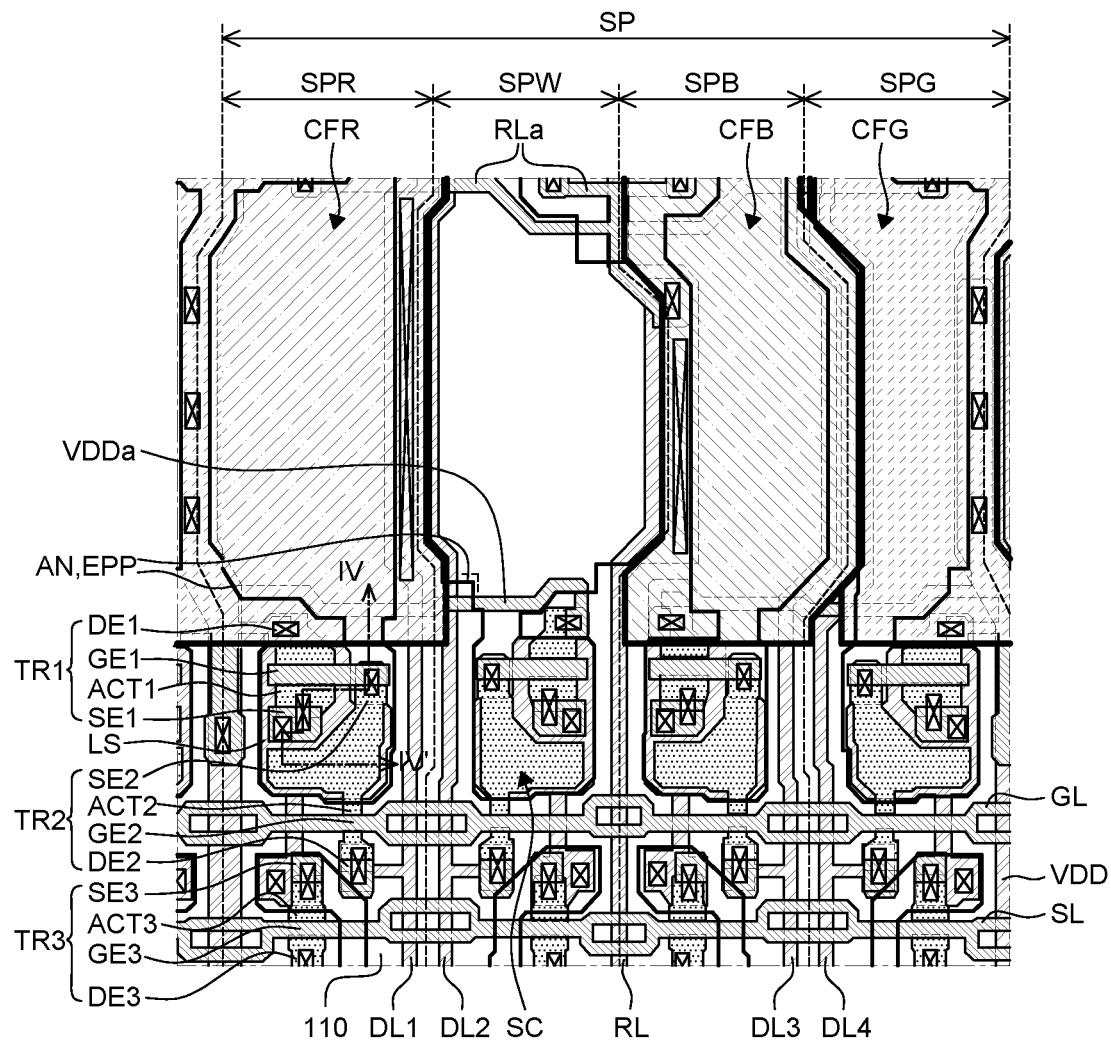
FIG. 3 is an enlarged plan view of the display device according to an exemplary embodiment of the present disclosure.
Figure 4:
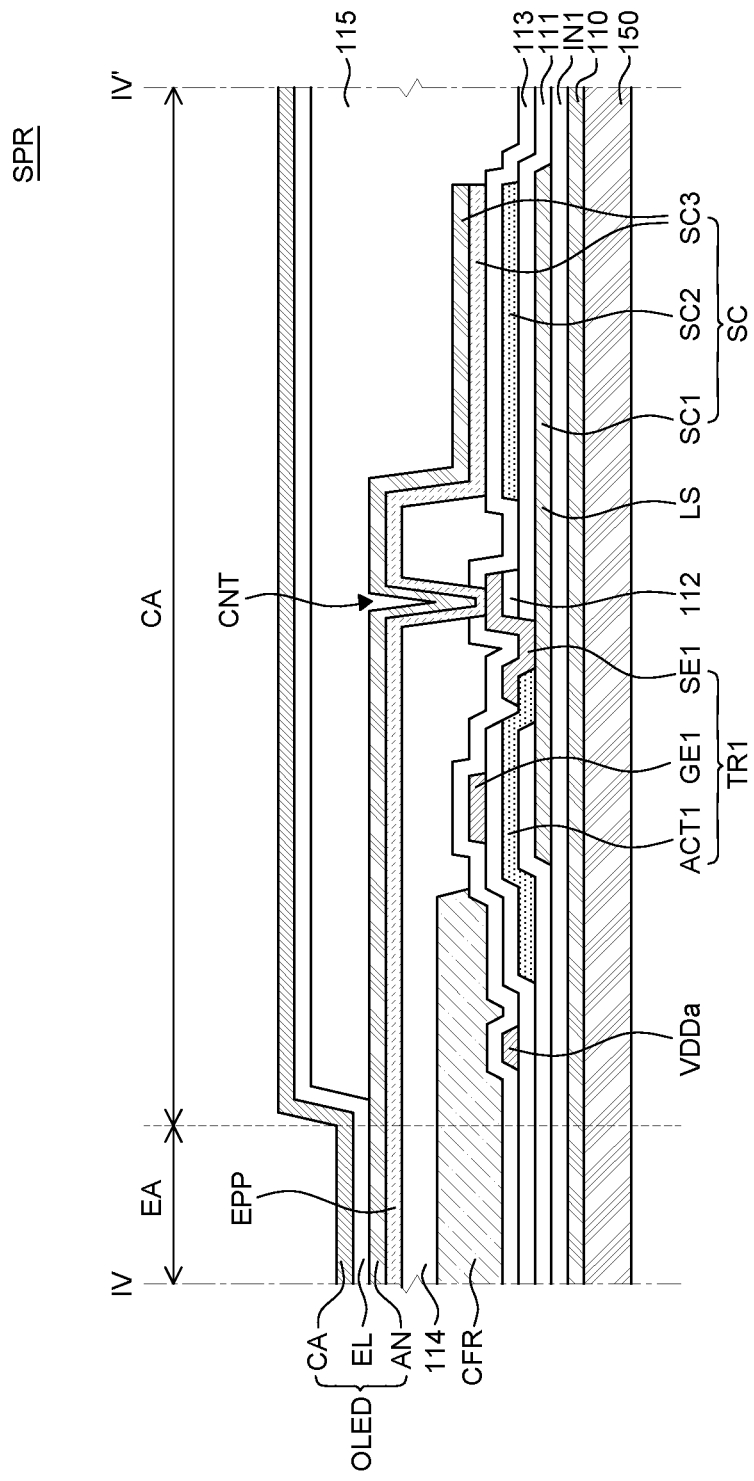
FIG. 4 is a cross-sectional view of FIG. 3, taken along line IV-IV' of FIG. 3.
Figure 5:
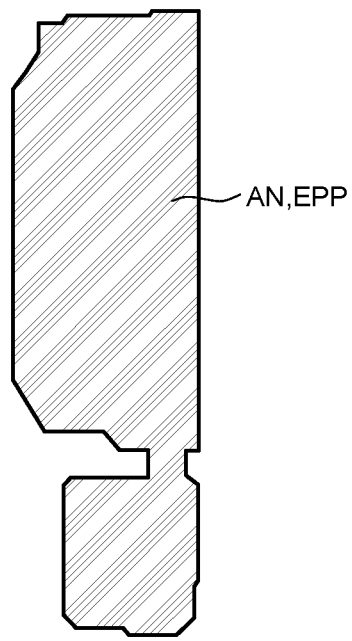
FIG. 5 is an enlarged plan view of an anode and a light emitting layer protective pattern in a red sub-pixel illustrated in FIG. 3.

FIG. 3 is an enlarged plan view of the display device according to an exemplary embodiment of the present disclosure. FIG. 4 is a cross-sectional view of FIG. 3, taken along line IV-IV' of FIG. 3. FIG. 5 is an enlarged plan view of an anode and a light emitting layer protective pattern in a red sub-pixel illustrated in FIG. 3. FIG. 3 is an enlarged plan view of a red sub-pixel SPR, a white sub-pixel SPW, a blue sub-pixel SPB and a green sub-pixel SPG included in each pixel. For the convenience of description, FIG. 3 does not illustrate a bank 115, but illustrates a plurality of color filters CF and an anode AN indicated by bold solid lines. Referring to FIG. 3 and FIG. 4, the display device 100 according to an exemplary embodiment of the present disclosure includes the lower substrate 110, an insulating layer IN, a buffer layer 111, a gate insulating layer 112, a passivation layer 113 and a planarization layer 114. Also, the display device 100 includes the bank 115, the first transistor TR1, the second transistor TR2 and the third transistor TR3, the storage capacitor SC and the light emitting element OLED. Further, the display device 100 includes the gate line GL, the sensing line SL, the data line DL, the reference line RL, the high potential power line VDD and the plurality of color filters CF.

Referring to FIG. 3, the plurality of sub-pixels SP include the red sub-pixel SPR, the green sub-pixel SPG, the blue sub-pixel SPB and the white sub-pixel SPW. For example, the red sub-pixel SPR, the white sub-pixel SPW, the blue sub-pixel SPB and the green sub-pixel SPG may be sequentially disposed in a row direction. However, the arrangement sequence of the plurality of sub-pixels SP is not limited thereto.

Each of the plurality of sub-pixels SP includes an emission area EA and a circuit area CA. The emission area EA is an area where one color light is independently emitted. The light emitting element OLED may be disposed in the emission area EA. Specifically, in an area where the plurality of color filters CF overlap the anode AN, a portion which is exposed by the bank 115 and trough which light emitted from the light emitting element OLED travels to the outside may be defined as the emission area EA. For example, referring to FIG. 3 and FIG. 4 together, the emission area EA of the red sub-pixel SPR may refer to a portion exposed by the bank 115 in an area where a red color filter CFR overlaps the anode AN. Also, the emission area EA of the green sub-pixel SPG may refer to a portion exposed by the bank 115 in an area where a green color filter CFG overlaps the anode AN. Further, the emission area EA of the blue sub-pixel SPB may refer to a portion exposed by the bank 115 in an area where a blue color filter CFB overlaps the anode AN. The emission area EA of the white sub-pixel SPW where no color filter CF is disposed may refer to a portion overlapping a part of the anode AN exposed by the bank 115.

The circuit area CA refers to an area except for the emission area EA. In the circuit area CA, a driving circuit DP for driving a plurality of light emitting elements OLED and a plurality of lines for transmitting various signals to the driving circuit DP may be disposed. Also, the circuit area CA in which the driving circuit DP, the plurality of lines and the bank 115 are disposed may be a non-emission area. For example, the driving circuit DP including the first transistor TR1, the second transistor TR2, the third transistor TR3 and the storage capacitor SC, a plurality of high potential power lines VDD, a plurality of data lines DL, a plurality of reference lines RL, a plurality of gate lines GL, the sensing line SL and the bank 115 may be disposed in the circuit area CA.

Referring to FIG. 3 and FIG. 4 together, the insulating layer IN is disposed on the lower substrate 110. The insulating layer IN may serve to suppress diffusion of moisture and/or oxygen permeating from the outside of the lower substrate 110. Permeation of moisture into the display device 100 can be controlled by controlling the thickness or the laminated structure of the insulating layer IN. Also, the insulating layer IN may serve to suppress shorts caused by contacting between the lower substrate 110 made of a transparent conducting oxide or an oxide semiconductor and other components. The insulating layer IN may be made of an inorganic material. For example, the insulating layer IN may be formed as a single layer or a multilayer of silicon oxide (SiOx) or silicon nitride (SiNx), but is not limited thereto.

A plurality of high potential power lines VDD, a plurality of data lines DL, a plurality of reference lines RL and a light shielding layer LS are disposed on the insulating layer IN. The plurality of high potential power lines VDD, the plurality of data lines DL, the plurality of reference lines RL and the light shielding layer LS may be disposed on the same layer on the lower substrate 110 and be made of the same conductive material. For example, the plurality of high potential power lines VDD, the plurality of data lines DL, the plurality of reference lines RL and the light shielding layer LS may be made of a metal material such as copper (Cu), aluminum (Al), molybdenum (Mo), nickel (Ni), titanium (Ti), chromium (Cr) or an alloy thereof, but are not limited thereto.

The plurality of high potential power lines VDD serve to transmit a high potential power voltage to the plurality of sub-pixels SP, respectively. The plurality of high potential power lines VDD may extend in the row direction between the plurality of sub-pixels SP. Two sub-pixels SP adjacent to each other in a column direction may share one of the plurality of high potential power lines VDD. For example, a high potential power line VDD may be disposed on the left side of the red sub-pixel SPR to supply a high potential power voltage to the first transistor TR1 in each of the red sub-pixel SPR and the white sub-pixel SPW. Another high potential power line VDD may be disposed on the right side of the green sub-pixel SPG to supply a high potential power voltage to the first transistor TR1 in each of the blue sub-pixel SPB and the green sub-pixel SPG.

The plurality of data lines DL extend in the column direction between the plurality of sub-pixels SP and serves to transmit a data voltage to the plurality of sub-pixels SP, respectively. The plurality of data lines DL includes a first data line DL1, a second data line DL2, a third data line DL3 and a fourth data line DL4. The first data line DL1 may be disposed between the red sub-pixel SPR and the white sub-pixel SPW and may serve to transmit a data voltage to the second transistor TR2 of the red sub-pixel SPR. The second data line DL2 may be disposed between the first data line DL1 and the white sub-pixel SPW and may serve to transmit a data voltage to the second transistor TR2 of the white sub-pixel SPW. The third data line DL3 may be disposed between the blue sub-pixel SPB and the green sub-pixel SPG and may serve to transmit a data voltage to the second transistor TR2 of the blue sub-pixel SPB. The fourth data line DL4 may be disposed between the third data line DL3 and the green sub-pixel SPG and may serve to transmit a data voltage to the second transistor TR2 of the green sub-pixel SPG.

The plurality of reference lines RL extend in the column direction between the plurality of sub-pixels SP and serve to transmit a reference voltage to the plurality of sub-pixels SP, respectively. The plurality of sub-pixels SP included in each pixel may share a single reference line RL. For example, a single reference line RL may be disposed between the white sub-pixel SPW and the blue sub-pixel SPB and may serve to transmit a reference voltage to the third transistor TR3 in each of the red sub-pixel SPR, the white sub-pixel SPW, the blue sub-pixel SPB and the green sub-pixel SPG.

Referring to FIG. 3 and FIG. 4, the light shielding layer LS is disposed on the lower substrate 110. The light shielding layer LS may be disposed to overlap at least a first active layer ACT1 of the first transistor TR1 among the plurality of transistors TR1, TR2 and TR3 and may block light incident onto the first active layer ACT1. If light is irradiated onto the first active layer ACT1, a leakage current is generated. Thus, the reliability of the first transistor TR1 serving as a driving transistor may be degraded. In this case, the light shielding layer LS made of an opaque conductive material such as copper (Cu), aluminum (Al), molybdenum (Mo), nickel (Ni), titanium (Ti), chromium (Cr) or an alloy thereof may be disposed to overlap the first active layer ACT1. Thus, it is possible to block light incident onto the first active layer ACT1 from a lower portion of the lower substrate 110. Therefore, the reliability of the first transistor TR1 can be improved. However, the present disclosure is not limited thereto. The light shielding layer LS may be disposed to overlap a second active layer ACT2 of the second transistor TR2 and a third active layer ACTS of the third transistor TR3.

Meanwhile, the light shielding layer LS is illustrated as a single layer, but the light shielding layer LS may be formed as a plurality of layers. For example, the light shielding layer LS may be formed as a plurality of layers disposed to overlap with at least one of the lower substrate 110, the buffer layer 111, the gate insulating layer 112 and the passivation layer 113 interposed therebetween.

The buffer layer 111 is disposed on the plurality of high potential power lines VDD, the plurality of data lines DL, the plurality of reference lines RL and the light shielding layer LS. The buffer layer 111 may serve to reduce permeation of moisture or impurities through the lower substrate 110. For example, the buffer layer 111 may be formed as a single layer or a multilayer of silicon oxide (SiOx) or silicon nitride (SiNx), but is not limited thereto. Also, the buffer layer 111 may be omitted depending on the type of the lower substrate 110 or the type of the transistor, but is not limited thereto.

The first transistor TR1, the second transistor TR2, the third transistor TR3 and the storage capacitor SC are disposed on the buffer layer 111 in each of the plurality of sub-pixels SP.

First, the first transistor TR1 includes the first active layer ACT1, a first gate electrode GE1, a first source electrode SE1 and a first drain electrode DE1.

The first active layer ACT1 is disposed on the buffer layer 111. The first active layer ACT1 may be made of a semiconductor material such as an oxide semiconductor, amorphous silicon or polysilicon, but is not limited thereto. For example, if the first active layer ACT1 is made of an oxide semiconductor, the first active layer ACT1 is formed by a channel region, a source region and a drain region. The source region and the drain region may be conductive regions, but are not limited thereto.

The gate insulating layer 112 is disposed on the first active layer ACT1. The gate insulating layer 112 serves to insulate the first gate electrode GE1 from the first active layer ACT1 and may be made of an insulating material. For example, the gate insulating layer 112 may be formed as a single layer or a multilayer of silicon oxide (SiOx) or silicon nitride (SiNx), but is not limited thereto.

The first gate electrode GE1 is disposed on the gate insulating layer 112 so as to overlap the first active layer ACT1. The first gate electrode GE1 may be made of a conductive material such as copper (Cu), aluminum (Al), molybdenum (Mo), nickel (Ni), titanium (Ti), chromium (Cr) or an alloy thereof, but is not limited thereto.

The first source electrode SE1 and the first drain electrode DE1 are disposed on the gate insulating layer 112 so as to be spaced apart from each other. The first source electrode SE1 and the first drain electrode DE1 may be electrically connected to the first active layer ACT1 through contact holes formed in the gate insulating layer 112. The first source electrode SE1 and the first drain electrode DE1 may be disposed on the same layer as the first gate electrode GE1 to be made of the same conductive material, but are not limited thereto. For example, the first source electrode SE1 and the first drain electrode DE1 may be made of copper (Cu), aluminum (Al), molybdenum (Mo), nickel (Ni), titanium (Ti), chromium (Cr) or an alloy thereof, but are not limited thereto.

The first drain electrode DE1 is electrically connected to the high potential power line VDD. For example, the first drain electrodes DE1 of the red sub-pixel SPR and the white sub-pixel SPW may be electrically connected to the high potential power line VDD on the left side of the red sub-pixel SPR. Also, the first drain electrodes DE1 of the blue sub-pixel SPB and the green sub-pixel SPG may be electrically connected to the high potential power line VDD on the right side of the green sub-pixel SPG.

In this case, to electrically connect the first drain electrode DE1 to the high potential power line VDD, an auxiliary high potential power line VDDa may be further disposed. One end of the auxiliary high potential power line VDDa may be electrically connected to the high potential power line VDD and the other end may be electrically connected to the respective first drain electrodes DE1 of the plurality of sub-pixels SP. For example, if the auxiliary high potential power line VDDa is disposed on the same layer as the first drain electrode DE1 to be made of the same material, one end of the auxiliary high potential power line VDDa may be electrically connected to the high potential power line VDD through contact holes formed in the gate insulating layer 112 and the buffer layer 111. Also, the other end of the auxiliary high potential power line VDDa may extend toward the first drain electrode DE1 and may be integrally formed with the first drain electrode DE1.

The first drain electrode DE1 of the red sub-pixel SPR and the first drain electrode DE1 of the white sub-pixel SPW which are electrically connected to the same high potential power line VDD may be connected to the same auxiliary high potential power line VDDa. Also, the first drain electrode DE1 of the blue sub-pixel SPB and the first drain electrode DE1 of the green sub-pixel SPG may be connected to the same auxiliary high potential power line VDDa. However, the first drain electrode DE1 may be electrically connected to the high potential power line VDD in other ways, and the present disclosure is not limited thereto.

The first source electrode SE1 may be electrically connected to the light shielding layer LS through contact holes formed in the gate insulating layer 112 and the buffer layer 111. Also, a part of the first active layer ACT1 connected to the first source electrode SE1 may be electrically connected to the light shielding layer LS through a contact hole formed in the buffer layer 111. If the light shielding layer LS floats, a threshold voltage of the first transistor TR1 may be changed, which may affect driving of the display device 100. Accordingly, the light shielding layer LS may be electrically connected to the first source electrode SE1 so as to apply a voltage to the light shielding layer LS and not to affect driving of the first transistor TR1. In the present disclosure, both the first active layer ACT1 and the first source electrode SE1 are described as being in contact with the light shielding layer LS. However, only one of the first source electrode SE1 and the first active layer ACT1 may be in direct contact with the light shielding layer LS, but the present disclosure is not limited thereto.

Meanwhile, FIG. 4 illustrates that the gate insulating layer 112 is patterned to overlap the first gate electrode GE1, the first source electrode SE1 and the first drain electrode DE1. However, the gate insulating layer 112 may be formed on the entire surface of the lower substrate 110, but is not limited thereto.

The second transistor TR2 includes the second active layer ACT2, a second gate electrode GE2, a second source electrode SE2 and a second drain electrode DE2.

The second active layer ACT2 is disposed on the buffer layer 111. The second active layer ACT2 may be made of a semiconductor material such as an oxide semiconductor, amorphous silicon or polysilicon, but is not limited thereto. For example, if the second active layer ACT2 is made of an oxide semiconductor, the second active layer ACT2 is formed by a channel region, a source region and a drain region. The source region and the drain region may be conductive regions, but are not limited thereto.

The second source electrode SE2 is disposed on the buffer layer 111. The second source electrode SE2 may be integrally formed with the second active layer ACT2 and thus may be electrically connected to each other. For example, a semiconductor material may be formed on the buffer layer 111 and a part of the semiconductor material may be made conductive to form the second source electrode SE2. Thus, a non-conductive part of the semiconductor material may become the second active layer ACT2 and the conductive part may become the second source electrode SE2. However, the second active layer ACT2 and the second source electrode SE2 may be separately formed, but the present disclosure is not limited thereto.

The second source electrode SE2 is electrically connected to the first gate electrode GE1 of the first transistor TR1. The first gate electrode GE1 may be electrically connected to the second source electrode SE2 through a contact hole formed in the gate insulating layer 112. Therefore, the first transistor TR1 may be turned on or off based on a signal from the second transistor TR2.

The gate insulating layer 112 is disposed on the second active layer ACT2 and the second source electrode SE2, and the second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL, and the second transistor TR2 may be turned on or off based on a gate voltage transmitted to the second gate electrode GE2. The second gate electrode GE2 may be made of a conductive material such as copper (Cu), aluminum (Al), molybdenum (Mo), nickel (Ni), titanium (Ti), chromium (Cr) or an alloy thereof, but is not limited thereto.

Meanwhile, the second gate electrode GE2 may extend from the gate line GL. That is, the second gate electrode GE2 may be integrally formed with the gate line GL, and the second gate electrode GE2 and the gate line GL may be made of the same conductive material. For example, the gate line GL may be made of copper (Cu), aluminum (Al), molybdenum (Mo), nickel (Ni), titanium (Ti), chromium (Cr) or an alloy thereof, but is not limited thereto.

The gate line GL serves to transmit a gate voltage to each of the plurality of sub-pixels SP, and may extend in the row direction to traverse the respective circuit areas CA of the plurality of sub-pixels SP. The gate line GL extends in the row direction so as to intersect the plurality of high potential power lines VDD, the plurality of data lines DL and the plurality of reference lines RL extending in the column direction.

The second drain electrode DE2 is disposed on the gate insulating layer 112. The second drain electrode DE2 may be electrically connected to the second active layer ACT2 through a contact hole formed in the gate insulating layer 112. Concurrently, the second drain electrode DE2 may be electrically connected to one of the plurality of data lines DL through contact holes formed in the gate insulating layer 112 and the buffer layer 111. For example, the second drain electrode DE2 of the red sub-pixel SPR may be electrically connected to the first data line DL1, and the second drain electrode DE2 of the white sub-pixel SPW may be electrically connected to the second data line DL2. For example, the second drain electrode DE2 of the blue sub-pixel SPB may be electrically connected to the third data line DL3, and the second drain electrode DE2 of the green sub-pixel SPG may be electrically connected to the fourth data line DL4. The second drain electrode DE2 may be made of a conductive material such as copper (Cu), aluminum (Al), molybdenum (Mo), nickel (Ni), titanium (Ti), chromium (Cr) or an alloy thereof, but is not limited thereto.

The third transistor TR3 includes the third active layer ACTS, a third gate electrode GE3, a third source electrode SE3 and a third drain electrode DE3.

The third active layer ACT3 is disposed on the buffer layer 111. The third active layer ACT3 may be made of a semiconductor material such as an oxide semiconductor, amorphous silicon or polysilicon, but is not limited thereto. For example, if the third active layer ACT3 is made of an oxide semiconductor, the third active layer ACT3 is formed by a channel region, a source region and a drain region. The source region and the drain region may be conductive regions, but are not limited thereto.

The gate insulating layer 112 is disposed on the third active layer ACT3, and the third gate electrode GE3, the third source electrode SE3 and the third drain electrode DE3 are disposed on the gate insulating layer 112.

The third gate electrode GE3 is disposed on the gate insulating layer 112 so as to overlap the third active layer ACT3. The third gate electrode GE3 may be electrically connected to the sensing line SL, and the third transistor TR3 may be turned on or off based on a sensing voltage transmitted to the third transistor TR3. The third gate electrode GE3 may be made of a conductive material such as copper (Cu), aluminum (Al), molybdenum (Mo), nickel (Ni), titanium (Ti), chromium (Cr) or an alloy thereof, but is not limited thereto.

Meanwhile, the third gate electrode GE3 may extend from the sensing line SL. That is, the third gate electrode GE3 may be integrally formed with the sensing line SL, and the third gate electrode GE3 and the sensing line SL may be made of the same conductive material. For example, the sensing line SL may be made of copper (Cu), aluminum (Al), molybdenum (Mo), nickel (Ni), titanium (Ti), chromium (Cr) or an alloy thereof, but is not limited thereto.

The sensing line SL serves to transmit a sensing voltage to each of the plurality of sub-pixels SP, and may extend in the row direction between the plurality of sub-pixels SP. For example, the sensing line SL extends in the row direction on the border between the plurality of sub-pixels SP so as to intersect the plurality of high potential power lines VDD, the plurality of data lines DL and the plurality of reference lines RL extending in the column direction.

The third source electrode SE3 may be electrically connected to the third active layer ACT3 through a contact hole formed in the gate insulating layer 112. The third source electrode SE3 may be made of a conductive material such as copper (Cu), aluminum (Al), molybdenum (Mo), nickel (Ni), titanium (Ti), chromium (Cr) or an alloy thereof, but is not limited thereto.

Meanwhile, a part of the third active layer ACT3 in contact with the third source electrode SE3 may be electrically connected to the light shielding layer LS through a contact hole formed in the buffer layer 111. That is, the third source electrode SE3 may be electrically connected to the light shielding layer LS with the third active layer ACT3 interposed therebetween. Therefore, the third source electrode SE3 and the first source electrode SE1 may be electrically connected to each other through the light shielding layer LS.

The third drain electrode DE3 may be electrically connected to the third active layer ACTS through a contact hole formed in the gate insulating layer 112. The third drain electrode DE3 may be made of a conductive material such as copper (Cu), aluminum (Al), molybdenum (Mo), nickel (Ni), titanium (Ti), chromium (Cr) or an alloy thereof, but is not limited thereto.

The third drain electrode DE3 may be electrically connected to the reference line RL. For example, the third drain electrodes DE3 of the red sub-pixel SPR, the white sub-pixel SPW, the blue sub-pixel SPB and the green sub-pixel SPG included in each pixel may be electrically connected to the same reference line RL. That is, the plurality of sub-pixels SP included in each pixel may share a single reference line RL.

In this case, to connect the reference line RL extending in the column direction to the plurality of sub-pixels SP disposed side by side in the row direction, an auxiliary reference line RLa may be disposed. The auxiliary reference line RLa may extend in the row direction and serve to electrically connect the reference line RL to the respective third drain electrodes DE3 of the plurality of sub-pixels SP. One end of the auxiliary reference line RLa may be electrically connected to the reference line RL through contact holes formed in the buffer layer 111 and the gate insulating layer 112. Also, the other end of the auxiliary reference line RLa may be electrically connected to the respective third drain electrodes DE3 of the plurality of sub-pixels SP. In this case, the auxiliary reference line RLa may be integrally formed with the respective third drain electrodes DE3 of the plurality of sub-pixels SP. Also, a reference voltage from the reference line RL may be transmitted to the third drain electrodes DE3 through the auxiliary reference line RLa. However, the auxiliary reference line RLa may be formed separately from the third drain electrode DE3, but the present disclosure is not limited thereto.

The storage capacitor SC is disposed in the circuit area CA of each of plurality of sub-pixels SP. The storage capacitor SC may store a voltage between the first gate electrode GE1 and the first source electrode SE1 of the first transistor TR1 to allow the light emitting element OLED to continuously maintain a constant state for one frame. The storage capacitor SC includes a first capacitor electrode SC1, a second capacitor electrode SC2 and a third capacitor electrode SC3.

The first capacitor electrode SC1 is disposed under the buffer layer 111 in each of the plurality of sub-pixels SP. The first capacitor electrode SC1 may be disposed to be the closest to the lower substrate 110 among the conductive components disposed on the lower substrate 110. The first capacitor electrode SC1 may be integrally formed with the light shielding layer LS and may be electrically connected to the first source electrode SE1 through the light shielding layer LS.

The buffer layer 111 is disposed on the first capacitor electrode SC1, and the second capacitor electrode SC2 is disposed on the buffer layer 111. The second capacitor electrode SC2 may be disposed to overlap the first capacitor electrode SC1. The second capacitor electrode SC2 may be integrally formed with the second source electrode SE2 and may be electrically connected to the second source electrode SE2 and the first gate electrode GE1. For example, a semiconductor material may be formed on the buffer layer 111 and a part of the semiconductor material may be made conductive to form the second source electrode SE2 and the second capacitor electrode SC2. Thus, a non-conductive part of the semiconductor material may serve as the second active layer ACT2 and the conductive part may serve as the second source electrode SE2 and the second capacitor electrode SC2. Also, as described above, the first gate electrode GE1 is electrically connected to the second source electrode SE2 through the contact hole formed in the gate insulating layer 112. Therefore, the second capacitor electrode SC2 may be integrally formed with the second source electrode SE2 and may be electrically connected to the second source electrode SE2 and the first gate electrode GE1.

The passivation layer 113 is disposed on the second capacitor electrode SC2, and the third capacitor electrode SC3 is disposed on the passivation layer 113. The third capacitor electrode SC3 may be disposed to overlap the first capacitor electrode SC1 and the second capacitor electrode SC2. The third capacitor electrode SC3 may be integrally formed with the anode AN and a light emitting layer protective pattern EPP and may be electrically connected to the first source electrode SE1.

In brief, the first capacitor electrode SC1 of the storage capacitor SC may be integrally formed with the light shielding layer LS and may be electrically connected to the light shielding layer LS, the first source electrode SE1 and the third source electrode SE3. Also, the second capacitor electrode SC2 may be integrally formed with the second source electrode SE2 and the second active layer ACT2 and may be electrically connected to the second source electrode SE2 and the first gate electrode GE1. Further, the third capacitor electrode SC3 may be integrally formed with the anode AN and the light emitting layer protective pattern EPP and may be electrically connected to the first source electrode SE1 and the third source electrode SE3. Therefore, the first capacitor electrode SC1 overlapping the second capacitor electrode SC2 with the buffer layer 111 interposed therebetween and the second capacitor electrode SC2 overlapping the third capacitor electrode SC3 with the passivation layer 113 interposed therebetween and the third capacitor electrode SC3 maintain a constant voltage of the first gate electrode GE1 and the first source electrode SE1 of the first transistor TR1 while the light emitting element OLED emits light. Thus, the light emitting element OLED can be maintained in the same state.

Referring to FIG. 3 and FIG. 4, the passivation layer 113 is disposed on the first transistor TR1, the second transistor TR2, the third transistor TR3 and the storage capacitor SC. The passivation layer 113 is an insulating layer for protecting the components under the passivation layer 113. For example, the passivation layer 113 may be formed as a single layer or a multilayer of silicon oxide (SiOx) or silicon nitride (SiNx), but is not limited thereto. The passivation layer 113 may be omitted depending on an exemplary embodiment of the present disclosure.

The plurality of color filters CF are disposed on the passivation layer 113 in the respective emission areas EA of the plurality of sub-pixels SP. As described above, the display device 100 according to an exemplary embodiment of the present disclosure is of the bottom emission type in which light emitted from the light emitting element OLED is emitted toward a lower portion of the light emitting element OLED and the lower substrate 110. Thus, the plurality of color filters CF may be disposed under the light emitting element OLED. For example, the plurality of color filters CF may be disposed between a plurality of light emitting layer protective patterns EPP to be described later and the lower substrate 110. Light emitted from the light emitting element OLED may be converted into various colors through the plurality of color filters CF.

The plurality of color filters CF includes the red color filter CFR, the blue color filter CFB and the green color filter CFG. The red color filter CFR may be disposed in the emission area EA of the red sub-pixel SPR among the plurality of sub-pixels SP. The blue color filter CFB may be disposed in the emission area EA of the blue sub-pixel SPB. Also, the green color filter CFG may be disposed in the emission area EA of the green sub-pixel SPG.

The planarization layer 114 is disposed on the passivation layer 113 and the plurality of color filters CF. The planarization layer 114 is an insulating layer that planarizes an upper portion of the lower substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL and the plurality of sensing lines SL are disposed. The planarization layer 114 may be made of an organic material. For example, the planarization layer 114 may be formed as a single layer or a multilayer of polyimide or photo acryl, but is not limited thereto The light emitting element OLED is disposed in the emission area EA of each of the plurality of sub-pixels SP. The light emitting element OLED is disposed on the planarization layer 114 in each of the plurality of sub-pixels SP. The light emitting element OLED includes the anode AN, a light emitting layer EL and a cathode CA.

The anode AN is disposed on the planarization layer 114 in the emission area EA. The anode AN supplies holes to the light emitting layer EL and thus may be made of a conductive material having a high work function. For example, the anode AN may be made of a transparent conductive material such as indium tin oxide (ITO) and indium zinc oxide (IZO), but is not limited thereto.

Meanwhile, the anode AN may extend toward the circuit area CA. A part of the anode AN may extend from the emission area EA toward the first source electrode SE1 of the circuit area CA. Also, it may be electrically connected to the first source electrode SE1 through contact holes CNT formed in the planarization layer 114 and the passivation layer 113. Therefore, the anode AN of the light emitting element OLED may extend toward the circuit area CA and may be electrically connected to the first source electrode SE1 of the first transistor TR1 and the third capacitor electrode SC3 of the storage capacitor SC.

The light emitting layer EL is disposed on the anode AN in the emission area EA and the circuit area CA. The light emitting layer EL may be formed as a single layer throughout the plurality of sub-pixels SP. That is, the respective light emitting layers EL of the plurality of sub-pixels SP may be connected to and integrally formed with each other. The light emitting layer EL may be configured as a single light emitting layer or may have a structure in which a plurality of light emitting layers emitting light of different colors are stacked. The light emitting layer EL may further include an organic layer such as a hole injection layer, a hole transport layer, an electron transport layer and an electron injection layer.

The cathode CA is disposed on the light emitting layer EL in the emission area EA and the circuit area CA. The cathode CA supplies electrons to the light emitting layer EL and thus may be made of a conductive material having a low work function. The cathode CA may be formed as a single layer throughout the plurality of sub-pixels SP. That is, the respective cathodes CA of the plurality of sub-pixels SP may be connected to and integrally formed with each other. The cathode CA may be made of a transparent conductive material such as indium tin oxide (ITO) and indium zinc oxide (IZO), or an alloy of ytterbium (Yb), and may further include a metal-doped layer. However, the present disclosure is not limited thereto. Meanwhile, although not shown in FIG. 4 and FIG. 5, the cathode CA of the light emitting element OLED may be electrically connected to low potential power line VSS and thus may be supplied with a low potential power voltage.

The bank 115 is disposed between the anode AN and the light emitting layer EL. The bank 115 is disposed to overlap the active area AA and cover an edge of the anode AN. The bank 115 is disposed on the border between sub-pixels SP adjacent to each other and may serve to reduce mixing of colors of light emitted from the respective light emitting elements OLED of the plurality of sub-pixels SP. The bank 115 may be made of an insulating material. For example, the bank 115 may be made of polyimide, acryl or a benzocyclobutene (BCB)-based resin, but is not limited thereto.

Referring to FIG. 3 and FIG. 4, the plurality of light emitting layer protective patterns EPP are disposed between the planarization layer 114 and the anode AN. The plurality of light emitting layer protective patterns EPP are disposed in the plurality of sub-pixels SP, respectively. The plurality of light emitting layer protective patterns EPP are disposed between the planarization layer 114 and the anode AN. Thus, the plurality of light emitting layer protective patterns EPP may serve to minimize damage to the light emitting layer EL caused by a laser beam irradiated from the lower substrate 110 side during an LLO process LLO. In this case, the plurality of light emitting layer protective patterns EPP may be in contact with the planarization layer 114 and the anode AN. That is, lower surfaces of the plurality of light emitting layer protective patterns EPP may be in contact with the planarization layer 114 and upper surfaces thereof may be in contact with the anode AN.

The plurality of light emitting layer protective patterns EPP may include a transparent conductive pattern and a photosensitive material. Herein, the photosensitive material of the plurality of light emitting layer protective patterns EPP may be doped in the transparent conductive pattern of the plurality of light emitting layer protective patterns EPP. The transparent conductive pattern of the plurality of light emitting layer protective patterns EPP may include at least one of niobium pentoxide ($NbO_5$), silver (Ag), antimony (Sb), platinum (Pt), chromium (Cr), vanadium (V) and nickel (Ni). The photosensitive material of the plurality of light emitting layer protective patterns EPP may include at least one of zinc oxide-based materials, titanium (Ti)-based materials and barium titanate ($BaTiO_3$)-based materials.

The plurality of light emitting layer protective patterns EPP includes the transparent conductive pattern and the photosensitive material as described above. Thus, the plurality of light emitting layer protective patterns EPP may protect the light emitting layer EL from light and heat generated from a laser beam irradiated during an LLO process. Specifically, the photosensitive material of the plurality of light emitting layer protective patterns EPP absorbs or scatters UV light in the UV light region. Thus, it is possible to minimize the approach of the light and heat generated from the laser beam to the light emitting layer EL.

The plurality of light emitting layer protective patterns EPP may be substantially transparent. Light emitted from the light emitting layer EL is emitted to a lower portion through the plurality of light emitting layer protective patterns EPP. Accordingly, the plurality of light emitting layer protective patterns EPP needs to have a high transmittance. For example, the plurality of light emitting layer protective patterns EPP may have a transmittance of 85% or more at about 550 nm in the visible light region, but is not limited thereto.

The plurality of light emitting layer protective patterns EPP may have the same shape as the anode AN on the plane. That is, the plurality of light emitting layer protective patterns EPP and the anode AN may completely overlap each other on the plane with the same shape and the same area. Accordingly, the plurality of light emitting layer protective patterns EPP and the anode AN may be formed in the same process using a single mask.

The plurality of light emitting layer protective patterns EPP completely overlaps the anode AN on the plane. Thus, the plurality of light emitting layer protective patterns EPP may be in contact with the first source electrode SE1 of the first transistor TR1 through the contact hole CNT formed in the planarization layer 114. That is, the first source electrode SE1 of the first transistor TR1 is opened through the contact hole CNT formed in the planarization layer 114. Also, the light emitting layer protective pattern EPP may be in contact with the first source electrode SE1 through the opened portion. Further, the anode AN is disposed on the light emitting layer protective pattern EPP so as to be in contact with the light emitting layer protective pattern EPP. Thus, the anode AN may be in contact with the plurality of light emitting layer protective patterns EPP at the contact hole CNT. Accordingly, the first source electrode SE1 may be electrically connected to the anode AN via the light emitting layer protective pattern EPP.

Referring to FIG. 4, a polarizing plate 150 is disposed under the lower substrate 110. The polarizing plate 150 may serve to selectively transmit light and reduce reflection of external light incident onto the lower substrate 110. Specifically, in the display device 100, various metal materials applied to semiconductor elements, lines, light emitting elements, etc. are formed on the lower substrate 110. Accordingly, external light incident onto the lower substrate 110 may be reflected from such a metal material, and, thus, visibility of the display device 100 may be degraded due to the reflection of the external light. In this case, it is possible to increase the outdoor visibility of the display device 100 by placing the polarizing plate 150, which suppress reflection of external light, under the lower substrate 110. However, the polarizing plate 150 may be omitted depending on an exemplary embodiment of the display device 100.

Although not illustrated in the drawings, a barrier film may be disposed together with the polarizing plate 150 under the lower substrate 110. The barrier film may serve to minimize permeation of moisture and oxygen outside the lower substrate 110 into the lower substrate 110 and protect the pixel unit including the light emitting elements. However, the barrier film may be omitted depending on an exemplary embodiment of the display device 100, but is not limited thereto.

In the display device 100 according to an exemplary embodiment of the present disclosure, the lower substrate 110 is made of any one of transparent conducting oxides and oxide semiconductors. Thus, the thickness of the display device 100 can be reduced. Conventionally, a plastic substrate has been used for a substrate of a display device. However, the plastic substrate is formed by coating and curing a plastic material at a high temperature. Therefore, it takes a long time to form the plastic substrate and it is difficult to form the plastic substrate to a predetermined thickness or less. However, transparent conducting oxides and oxide semiconductors can be formed to a very small thickness by a deposition process such as sputtering. Accordingly, in the display device 100 according to an exemplary embodiment of the present disclosure, the lower substrate 110 that supports various components of the display device 100 is made by using a transparent conducting oxide layer or an oxide semiconductor layer. Thus, it is possible to reduce the thickness of the display device 100 and implement a slim design.

Also, in the display device 100 according to an exemplary embodiment of the present disclosure, the lower substrate 110 is made of a transparent conducting oxide or an oxide semiconductor. Thus, it is possible to improve flexibility of the display device 100 and reduce stress generated when the display device 100 is deformed. Specifically, if the lower substrate 110 is made of a transparent conducting oxide or an oxide semiconductor, the lower substrate 110 can be formed into an ultra-thin film. In this case, the lower substrate 110 may also be referred to as a first transparent thin film layer. Accordingly, the display device 100 including the lower substrate 110 can have flexibility and the display device 100 can be easily bent or rolled. Accordingly, in the display device 100 according to an exemplary embodiment of the present disclosure, the lower substrate 110 is made by using any one of a transparent conducting oxide layer and an oxide semiconductor layer. Thus, it is possible to improve flexibility of the display device 100 and relieve stress generated when the display device 100 is deformed. Therefore, it is possible to minimize the occurrence of a crack or the like in the display device 100.

Further, in the display device 100 according to an exemplary embodiment of the present disclosure, the lower substrate 110 is made by using any one of a transparent conducting oxide layer and an oxide semiconductor layer. Thus, it is possible to reduce the generation of static electricity in the lower substrate 110. If the lower substrate 110 is made of plastic and static electricity is generated in the lower substrate 110, static electricity may damage various lines and driving elements on the lower substrate 110 or affect driving of the lower substrate 110. Therefore, the display quality may be degraded. However, if the lower substrate 110 is made by using a transparent conducting oxide layer or an oxide semiconductor layer, it is possible to minimize the generation of static electricity in the lower substrate 110. Also, it is possible to simplify a component for blocking or discharging static electricity. Therefore, in the display device 100 according to an exemplary embodiment of the present disclosure, the lower substrate 110 is made by using a transparent conducting oxide layer or an oxide semiconductor layer in which static electricity is less likely to be generated. Thus, it is possible to minimize damage or display quality degradation caused by static electricity.

Further, in the display device 100 according to an exemplary embodiment of the present disclosure, the lower substrate 110 is made of one of transparent conducting oxides and oxide semiconductors. Thus, it is possible to minimize permeation of external moisture or oxygen into the display device 100 through the lower substrate 110. If the lower substrate 110 is made by using a transparent conducting oxide layer or an oxide semiconductor layer, the lower substrate 110 is formed in a vacuum environment. Therefore, the possibility of formation of foreign materials is remarkably low. Also, even if foreign materials are formed, they are very small in size. Thus, it is possible to minimize permeation of moisture or oxygen into the display device 100. Therefore, in the display device 100 according to an exemplary embodiment of the present disclosure, the lower substrate 110 is made of a transparent conducting oxide or an oxide semiconductor which has a low possibility of formation of foreign materials and an excellent resistance to permeation of moisture. Thus, it is possible to improve the reliability of the light emitting element OLED including an organic layer and the display device 100.

Furthermore, in the display device 100 according to an exemplary embodiment of the present disclosure, the lower substrate 110 is made of any one of transparent conducting oxides or oxide semiconductors. Thus, a thin and cheap barrier film may be attached to a lower portion of the lower substrate 110. If the lower substrate 110 is made of a material having a low resistance to permeation of moisture, for example, plastic, a thick and expensive high-performance barrier film may be attached to the lower substrate 110 to reinforce the resistance to permeation of moisture. However, in the display device 100 according to an exemplary embodiment of the present disclosure, the lower substrate 110 is made of a transparent conducting oxide or an oxide semiconductor which has an excellent resistance to permeation of moisture. Thus, a thin and cheap barrier film can be attached to the lower substrate 110. Therefore, in the display device 100 according to an exemplary embodiment of the present disclosure, the lower substrate 110 is made of any one of transparent conducting oxides or oxide semiconductors which have an excellent resistance to permeation of moisture. Thus, it is possible to reduce manufacturing costs of the display device.

In the display device 100 according to an exemplary embodiment of the present disclosure, the lower substrate 110 is made of any one of transparent conducting oxides or oxide semiconductors. Thus, the lower substrate 110 can be subjected to an LLO process. While the display device 100 is manufactured, a temporary substrate including a sacrificial layer is attached under the lower substrate 110. Then, the pixel unit may be formed on the lower substrate 110. The sacrificial layer may be made of, for example, hydrogenated amorphous silicon or hydrogenated amorphous silicon doped with impurities. After the display device 100 is completely manufactured, a laser beam is irradiated from under the temporary substrate, and, thus, the sacrificial layer may be dehydrogenated. Also, the sacrificial layer and the temporary substrate may be separated from the lower substrate 110. In this case, transparent conducting oxides and oxide semiconductors are suitable for an LLO process with the sacrificial layer and the temporary substrate. Thus, even if the lower substrate 110 is made of nay one of transparent conducting oxides and oxide semiconductors, the lower substrate 110 can be easily separated from the temporary substrate. Therefore, in the display device 100 according to an exemplary embodiment of the present disclosure, the lower substrate 110 is made by using one of a transparent conducting oxide layer of an oxide semiconductor which is suitable for an LLO. Thus, it is possible to easily manufacture the display device by a conventional process with a conventional apparatus.

Meanwhile, during the above-described LLO process, a laser beam is irradiated from under the temporary substrate. In this case, the light emitting layer may be damaged by the laser beam. During the LLO process, the sacrificial layer may be crystallized. In this case, the crystallized sacrificial layer may expand, which forms an empty space. Therefore, a transmittance of the laser beam through the sacrificial layer is increased. During the LLO process, the laser irradiation is essential. Thus, thermal energy caused by the irradiated laser is transmitted upwards and to the light emitting layer. That is, if a laser beam reaches the light emitting layer passing through the components disposed under the light emitting layer, light and heat caused by the laser beam may damage the light emitting layer. If the light emitting layer is damaged by the laser beam, the corresponding light emitting element cannot normally emit light and a driving error may occur in the display device.

Accordingly, in the display device 100 according to an exemplary embodiment of the present disclosure, the plurality of light emitting layer protective patterns EPP are disposed between the planarization layer 114 and the anode AN. Thus, it is possible to minimize damage to the light emitting layer EL during an LLO process. That is, the light emitting layer protective pattern EPP including the transparent conductive pattern and the photosensitive material doped in the transparent conductive pattern is disposed between the planarization layer 114 and the anode AN. Thus, it is possible to suppress damage to the light emitting layer EL caused by light and heat generated from the laser beam. Therefore, in the display device 100 according to an exemplary embodiment of the present disclosure, the plurality of light emitting layer protective patterns EPP can suppress damage to the light emitting layer EL and suppress the occurrence of a driving error caused by the damage to the light emitting layer EL.

Meanwhile, the anode may be cracked or shorted by the laser beam irradiated during the LLO process. If the anode is cracked or shorted, the anode may be disconnected from the first transistor, and, thus, the light emitting element cannot normally emit light.

Also, the anode may be damaged by the laser beam irradiated during the LLO process. For example, if the anode is made of a transparent conducting oxide such as indium tin oxide (ITO), the anode may be melted and then cooled by optical and thermal effects of the laser beam due to amorphous properties of the constituent material. Also, the constituent material may be debonded and a gas such as oxygen may be discharged. In this process, the anode may not be completely cracked or shorted, but it may be damaged, which may cause an increase in resistance of the anode. If the resistance of the anode is increased, a band gap between the anode and the light emitting layer is decreased. Thus, the anode may be degraded in generating holes or injecting holes.

Accordingly, in the display device 100 according to an exemplary embodiment of the present disclosure, the plurality of light emitting layer protective patterns EPP may be in contact with the anode AN. That is, the lower surfaces of the plurality of light emitting layer protective patterns EPP may be in contact with the planarization layer 114 and the upper surfaces thereof may be in contact with the anode AN.

Since the light emitting layer protective pattern EPP is in contact with the anode AN, the light emitting layer protective pattern EPP may serve as an auxiliary electrode of the anode AN. Therefore, in the display device 100 according to an exemplary embodiment of the present disclosure, even if the anode AN is cracked or shorted during the LLO process, the light emitting layer protective pattern EPP can maintain an electrical connection with the first source electrode SE1 of the first transistor TR1 in the emission area EA. Also, in the display device 100 according to an exemplary embodiment of the present disclosure, even if the anode AN is damaged during the LLO process and the resistance of the anode AN is increased, the light emitting layer protective pattern EPP in contact with the anode AN can minimize an increase in resistance.

Further, in the display device 100 according to an exemplary embodiment of the present disclosure, the plurality of light emitting layer protective patterns EPP and the anode AN may completely overlap each other with the same shape. That is, the light emitting layer protective pattern EPP and the anode AN may overlap to completely correspond to each other on the plane. Accordingly, during a manufacturing process of the display device 100 according to an exemplary embodiment of the present disclosure, the light emitting layer protective pattern EPP may be patterned using the same mask as used for patterning the anode AN. Therefore, the light emitting layer protective pattern EPP may be formed without adding a separate mask.

Figure 6:
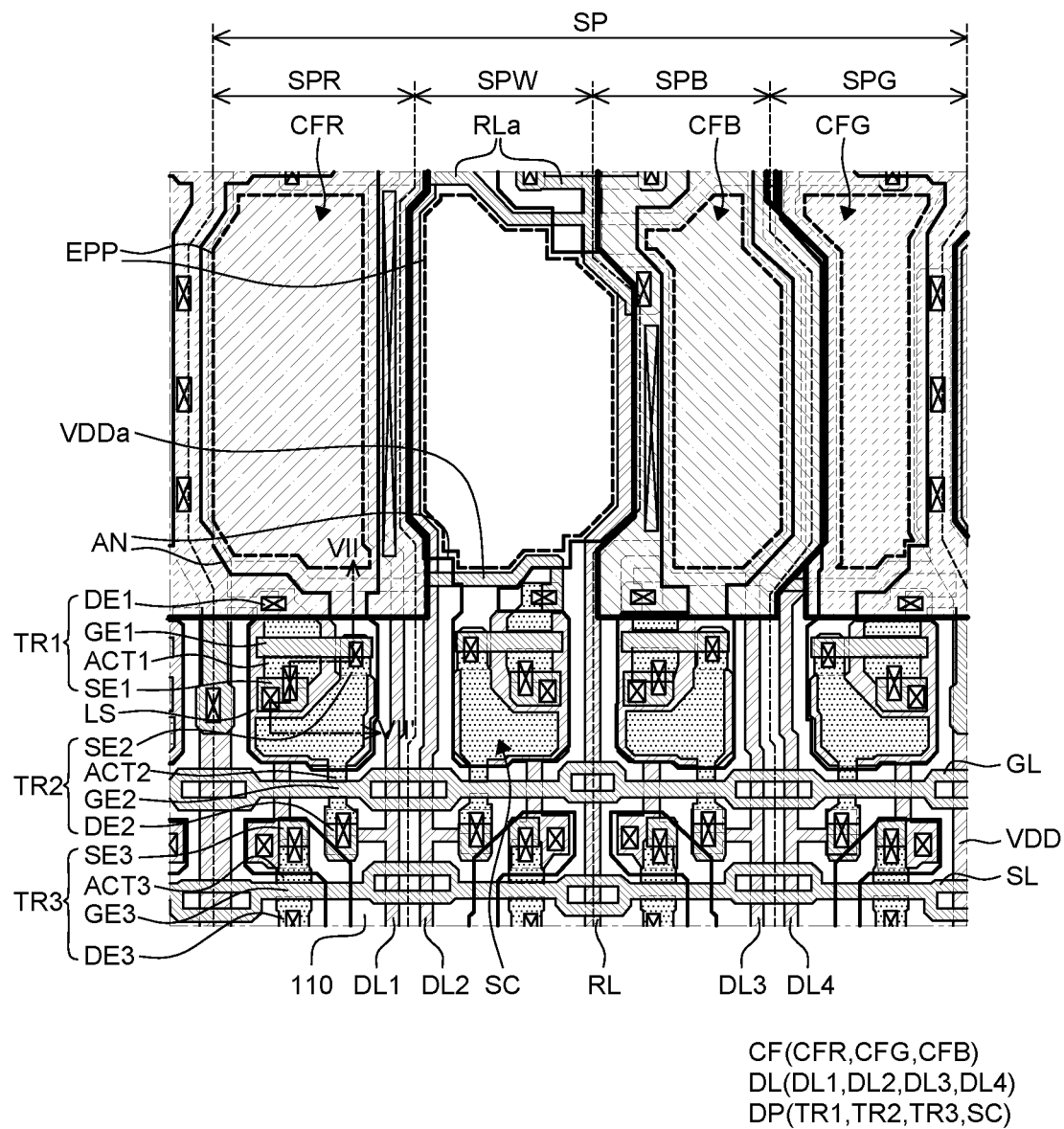
FIG. 6 is an enlarged plan view of a display device according to another exemplary embodiment of the present disclosure.
Figure 7:
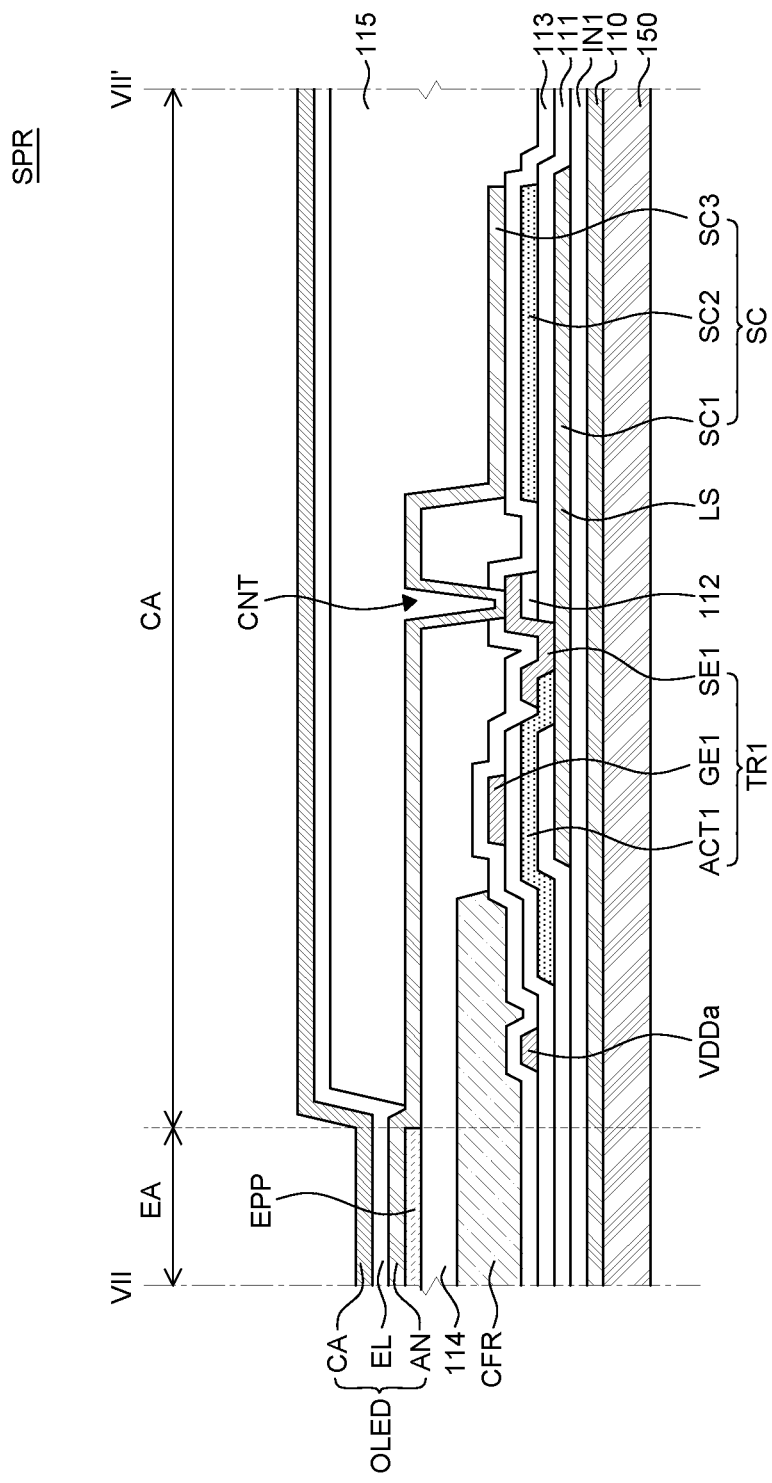
FIG. 7 is a cross-sectional view of FIG. 6, taken along line VII-VII' of FIG. 6.
Figure 8:
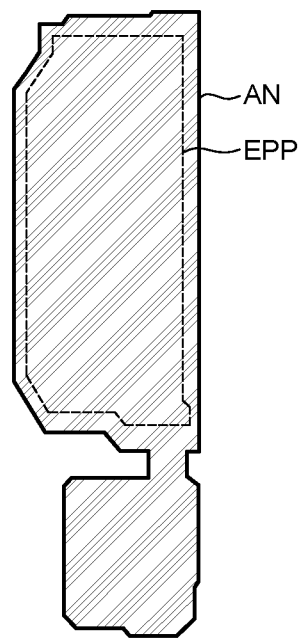
FIG. 8 is an enlarged plan view of an anode and a light emitting layer protective pattern in a red sub-pixel illustrated in FIG. 6.

FIG. 6 is an enlarged plan view of a display device according to another exemplary embodiment of the present disclosure. FIG. 7 is a cross-sectional view of FIG. 6, taken along line VII-VII' of FIG. 6. FIG. 8 is an enlarged plan view of an anode and a light emitting layer protective pattern in a red sub-pixel illustrated in FIG. 6. A display device 200 shown in FIG. 6 through FIG. 8 is substantially the same as the display device 100 shown in FIG. 1 through FIG. 5 except the storage capacitor SC and the light emitting layer protective pattern EPP. Therefore, a redundant description thereof will be omitted. In FIG. 6, the light emitting layer protective pattern EPP is indicated by a bold broken line.

Referring to FIG. 6 through FIG. 8, the plurality of light emitting layer protective patterns EPP are disposed between the planarization layer 114 and the anode AN. The plurality of light emitting layer protective patterns EPP are disposed in the plurality of sub-pixels SP, respectively. The plurality of light emitting layer protective patterns EPP are disposed between the planarization layer 114 and the anode AN. Thus, the plurality of light emitting layer protective patterns EPP may serve to minimize damage to the light emitting layer EL caused by a laser beam irradiated from the lower substrate 110 side during an LLO process LLO. In this case, the plurality of light emitting layer protective patterns EPP may be in contact with the planarization layer 114 and the anode AN. That is, lower surfaces of the plurality of light emitting layer protective patterns EPP may be in contact with the planarization layer 114 and upper surfaces thereof may be in contact with the anode AN.

The plurality of light emitting layer protective patterns EPP may include a transparent conductive pattern and a photosensitive material. Herein, the photosensitive material of the plurality of light emitting layer protective patterns EPP may be doped in the transparent conductive pattern of the plurality of light emitting layer protective patterns EPP.

The plurality of light emitting layer protective patterns EPP may overlap the emission area EA among the emission area EA and the circuit area CA. That is, the plurality of light emitting layer protective patterns EPP may be disposed at a portion exposed by the bank 115 in an area where the anode AN is disposed. Since the plurality of light emitting layer protective patterns EPP are disposed in the emission area EA, the anode AN may be in contact with the first source electrode SE1 of the first transistor TR1 through the contact hole CNT formed in the planarization layer 114.

The storage capacitor SC is disposed in the circuit area CA of each of the plurality of sub-pixels SP. The storage capacitor SC includes the first capacitor electrode SC1, the second capacitor electrode SC2 and the third capacitor electrode SC3. In this case, as described above, the plurality of light emitting layer protective patterns EPP are disposed in the emission area EA among the emission area EA and the circuit area CA. Thus, the third capacitor electrode SC3 may be integrally formed with the anode AN.

In the display device 200 according to another exemplary embodiment of the present disclosure, the plurality of light emitting layer protective patterns EPP are disposed between the planarization layer 114 and the anode AN. Thus, it is possible to minimize damage to the light emitting layer EL during an LLO process. Particularly, the light emitting layer protective pattern EPP is disposed under the anode AN in the emission area EA where the light emitting layer EL emits light. Thus, the light emitting layer protective pattern EPP can suppress damage to the light emitting layer EL caused by light and heat generated from a laser beam. Therefore, in the display device 200 according to another exemplary embodiment of the present disclosure, the plurality of light emitting layer protective patterns EPP can suppress damage to the light emitting layer EL and suppress the occurrence of a driving error caused by the damage to the light emitting layer EL.

Also, in the display device 200 according to another exemplary embodiment of the present disclosure, the plurality of light emitting layer protective patterns EPP may be in contact with the anode AN in the emission area EA. Accordingly, the light emitting layer protective pattern EPP may serve as an auxiliary electrode of the anode AN. Therefore, in the display device 200 according to another exemplary embodiment of the present disclosure, even if the anode AN is cracked or shorted in the emission area EA during the LLO process LLO, the light emitting layer protective pattern EPP can maintain an electrical connection of the anode AN in the emission area EA. Also, in the display device 200 according to another exemplary embodiment of the present disclosure, even if the anode AN is damaged during the LLO process and the resistance of the anode AN is increased, the light emitting layer protective pattern EPP in contact with the anode AN can minimize an increase in resistance.

Further, in the display device 200 according to another exemplary embodiment of the present disclosure, the plurality of light emitting layer protective patterns EPP are disposed in the emission area EA among the emission area EA and the circuit area CA. Accordingly, the light emitting layer protective pattern EPP may not overlap various conductive components disposed in the circuit area CA. Accordingly, in the display device 200 according to another exemplary embodiment of the present disclosure, a parasitic capacitance between the light emitting layer protective pattern EPP and other conductive component of the circuit area CA can be minimized. It may be more advantageous in maintaining design characteristics of the storage capacitor SC.

Figure 9:
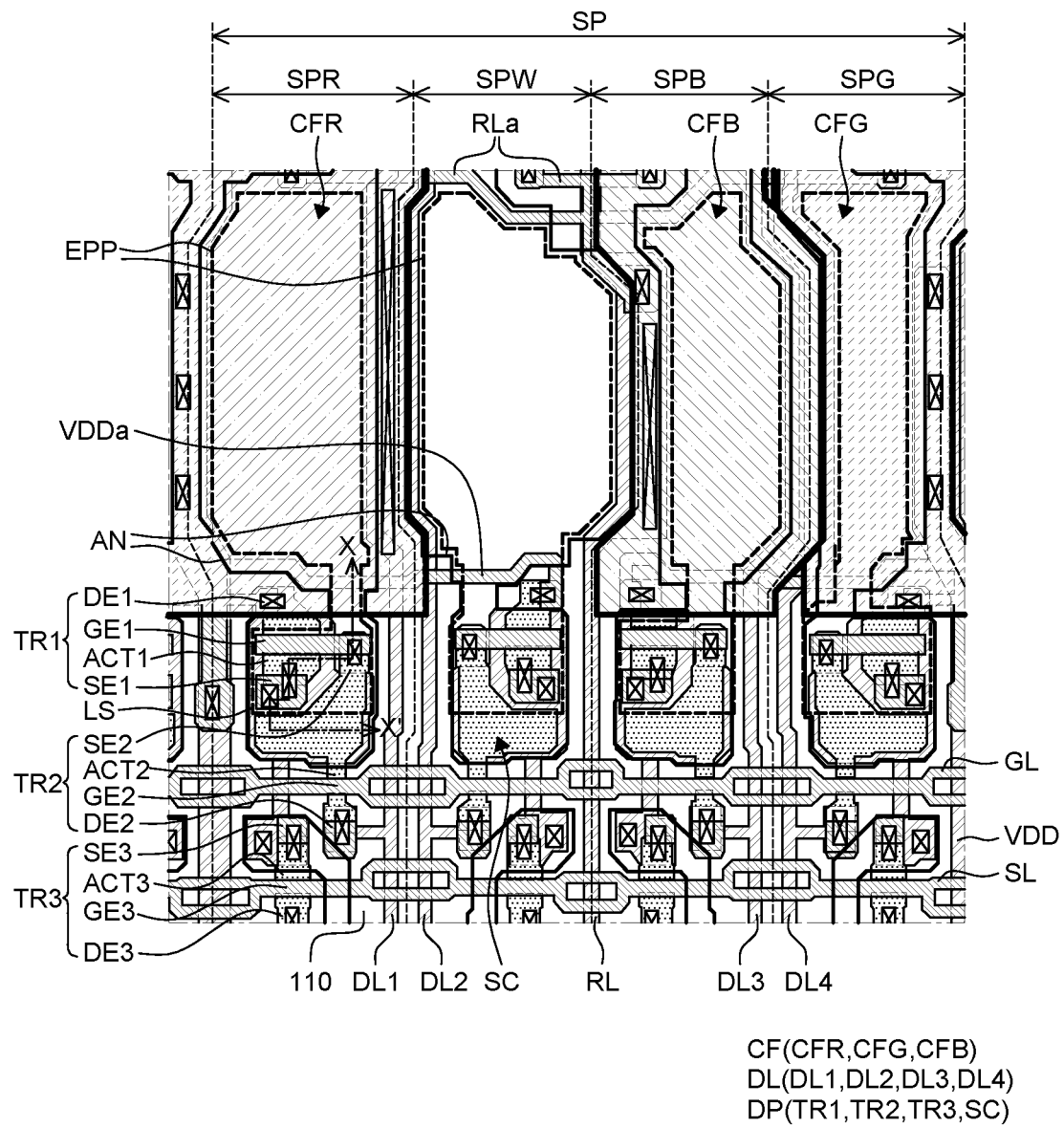
FIG. 9 is an enlarged plan view of a display device according to yet another exemplary embodiment of the present disclosure.
Figure 10:
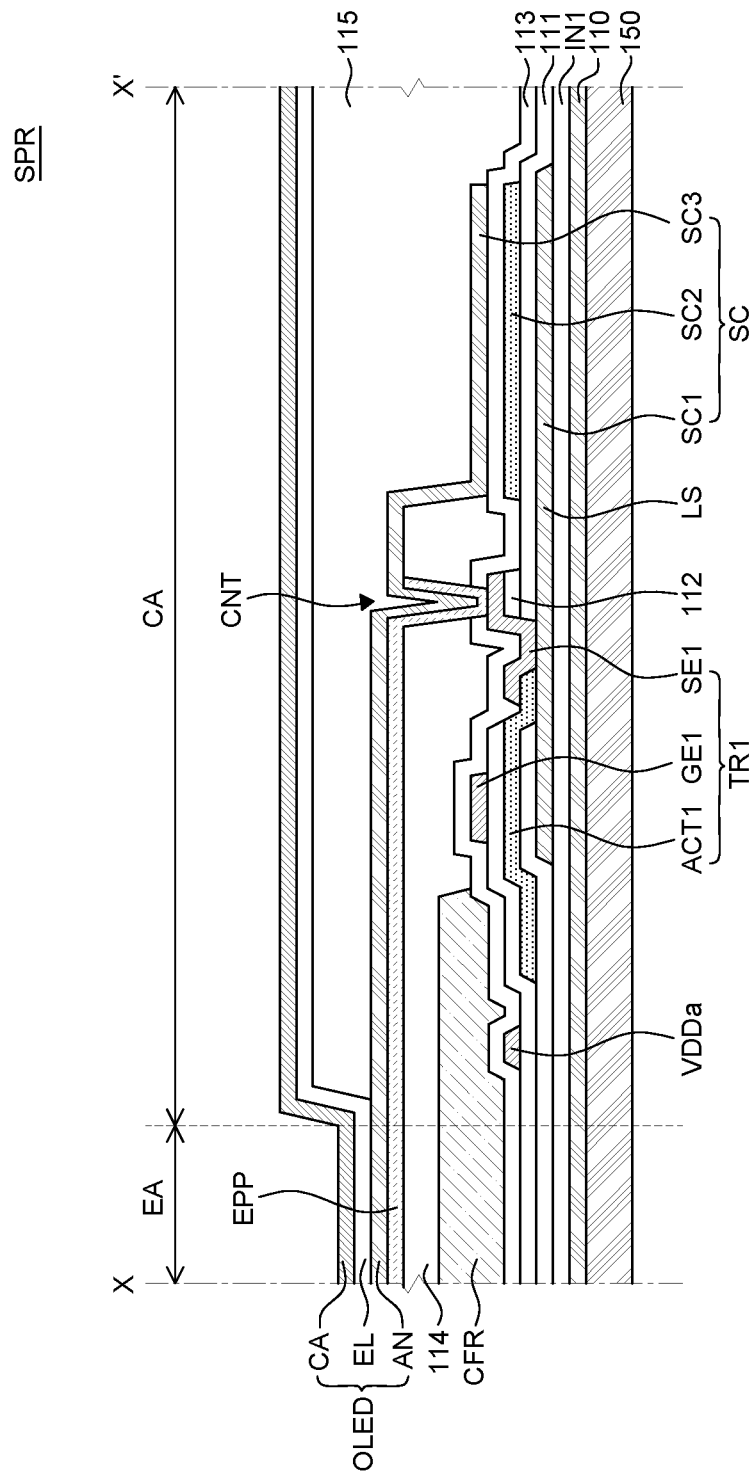
FIG. 10 is a cross-sectional view of FIG. 9, taken along line X-X' of FIG. 9.

FIG. 9 is an enlarged plan view of a display device according to yet another exemplary embodiment of the present disclosure. FIG. 10 is a cross-sectional view of FIG.

Figure 11:
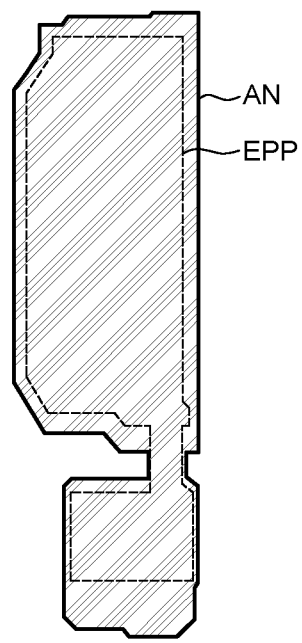
FIG. 11 is an enlarged plan view of an anode and a light emitting layer protective pattern in a red sub-pixel illustrated in FIG. 9.

9, taken along line X-X' of FIG. 9. FIG. 11 is an enlarged plan view of an anode and a light emitting layer protective pattern in a red sub-pixel illustrated in FIG. 9. A display device 300 shown in FIG. 9 through FIG. 11 is substantially the same as the display device 200 shown in FIG. 6 through FIG. 8 except the light emitting layer protective pattern EPP. Therefore, a redundant description thereof will be omitted. In FIG. 9, the light emitting layer protective pattern EPP is indicated by a bold broken line.

Referring to FIG. 9 through FIG. 11, the plurality of light emitting layer protective patterns EPP are disposed between the planarization layer 114 and the anode AN. The plurality of light emitting layer protective patterns EPP are disposed in the plurality of sub-pixels SP, respectively. The plurality of light emitting layer protective patterns EPP are disposed between the planarization layer 114 and the anode AN. Thus, the plurality of light emitting layer protective patterns EPP may serve to minimize damage to the light emitting layer EL caused by a laser beam irradiated from the lower substrate 110 side during an LLO process LLO. In this case, the plurality of light emitting layer protective patterns EPP may be in contact with the planarization layer 114 and the anode AN. That is, lower surfaces of the plurality of light emitting layer protective patterns EPP may be in contact with the planarization layer 114 and upper surfaces thereof may be in contact with the anode AN.

The plurality of light emitting layer protective patterns EPP may include a transparent conductive pattern and a photosensitive material. Herein, the photosensitive material of the plurality of light emitting layer protective patterns EPP may be doped in the transparent conductive pattern of the plurality of light emitting layer protective patterns EPP.

The plurality of light emitting layer protective patterns EPP may be disposed to overlap the emission area EA and a part of the circuit area CA adjacent to the emission area EA. In this case, the light emitting layer protective pattern EPP may extend from the emission area EA to the contact hole CNT formed in the planarization layer 114. Accordingly, the light emitting layer protective pattern EPP may be in contact with the first source electrode SE1 of the first transistor TR1 through the contact hole CNT formed in the planarization layer 114. That is, the first source electrode SE1 of the first transistor TR1 is opened through the contact hole CNT formed in the planarization layer 114. Also, the light emitting layer protective pattern EPP may be in contact with the first source electrode SE1 through the opened portion. Further, the anode AN is disposed on the light emitting layer protective pattern EPP so as to be in contact with the light emitting layer protective pattern EPP. Thus, the anode AN may be in contact with the plurality of light emitting layer protective patterns EPP at the contact hole CNT. Accordingly, the first source electrode SE1 may be electrically connected to the anode AN via the light emitting layer protective pattern EPP.

In the display device 300 according to yet another exemplary embodiment of the present disclosure, the plurality of light emitting layer protective patterns EPP are disposed between the planarization layer 114 and the anode AN. Thus, it is possible to minimize damage to the light emitting layer EL during an LLO process. Particularly, the light emitting layer protective pattern EPP is disposed under the anode AN in the emission area EA where the light emitting layer EL emits light. Thus, the light emitting layer protective pattern EPP can suppress damage to the light emitting layer EL caused by light and heat generated from a laser beam. Therefore, in the display device 300 according to yet another exemplary embodiment of the present disclosure, the plurality of light emitting layer protective patterns EPP can suppress damage to the light emitting layer EL and suppress the occurrence of a driving error caused by the damage to the light emitting layer EL.

Meanwhile, if the laser beam irradiated during the LLO process reaches the contact hole, a lift-off or an contact error may occur between the components disposed at the contact hole. Also, even if the laser beam does not directly reach the contact hole, when the anode adjacent to the contact hole is damaged, the damage may be propagated to the contact hole.

Accordingly, in the display device 300 according to yet another exemplary embodiment of the present disclosure, the light emitting layer protective pattern EPP may extend from the emission area EA to the contact hole CNT formed in the planarization layer 114. Accordingly, the first source electrode SE1 of the first transistor TR1 may be opened through the contact hole CNT formed in the planarization layer 114. Also, the light emitting layer protective pattern EPP may be in contact with the first source electrode SE1 through the opened portion. Further, the anode AN is disposed on the light emitting layer protective pattern EPP so as to be in contact with the light emitting layer protective pattern EPP. Thus, the anode AN may be in contact with the plurality of light emitting layer protective patterns EPP at the contact hole CNT. Accordingly, in the display device 300 according to yet another exemplary embodiment of the present disclosure, it is possible to suppress a lift-off or contact error which may occur between the components disposed at the contact hole.

The exemplary embodiments of the present disclosure can also be described as follows:

According to an aspect of the present invention, display device having an active area including a plurality of sub-pixels and a non-active area, the display device comprising: a substrate made of a transparent conducting oxide or an oxide semiconductor; a plurality of transistors disposed in the plurality of sub-pixels on the substrate; a planarization layer disposed on the plurality of transistors; a plurality of light emitting elements disposed on the planarization layer in the plurality of sub-pixels; and a plurality of light emitting layer protective patterns disposed between the planarization layer and an anode of at least one of the light emitting elements, the light emitting layer protective patterns including photosensitive material.

According to an aspect of the present disclosure, a display device having an active area including a plurality of sub-pixels and a non-active area, comprises a lower substrate made of a transparent conducting oxide or an oxide semiconductor, a plurality of transistors disposed in the plurality of sub-pixels on the lower substrate, planarization layer disposed on the plurality of transistors, plurality of light emitting elements disposed on the planarization layer in the plurality of sub-pixels and including an anode, a light emitting layer and a cathode and a plurality of light emitting layer protective patterns disposed between the planarization layer and the anode.

The plurality of light emitting layer protective patterns and the anode may completely overlap each other with the same shape.

The plurality of sub-pixels may include an emission area and a circuit area where the plurality of transistors is disposed, and the plurality of light emitting layer protective patterns overlaps the emission area.

The planarization layer may include a contact hole through which a source electrode of the plurality of transistors is opened, the plurality of light emitting layer protective patterns is in contact with the source electrode through the contact hole, and the anode is in contact with the plurality of light emitting layer protective patterns at the contact hole.

The plurality of light emitting elements may include an emission area and a circuit area where the plurality of transistors and a storage capacitor are disposed, and the plurality of light emitting layer protective patterns is disposed not to overlap the storage capacitor.

Lower surfaces of the plurality of light emitting layer protective patterns may be in contact with the planarization layer and upper surfaces thereof are in contact with the anode.

The plurality of light emitting layer protective patterns may include a transparent conductive pattern and a photosensitive material doped in the transparent conductive pattern.

The photosensitive material of the plurality of light emitting layer protective patterns may absorb or scatter UV light in the UV light region and has a transmittance of 85% or more in the visible light region.

The photosensitive material may include at least one of zinc oxide-based materials, titanium (Ti)-based materials and barium titanate (BaTiO3)-based materials.

The transparent conductive pattern may include at least one of niobium pentoxide (NbO5), silver (Ag), antimony (Sb), platinum (Pt), chromium (Cr), vanadium (V) and nickel (Ni).

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device having an active area including a plurality of sub-pixels and a non-active area, the display device comprising:
    a substrate made of a transparent conducting oxide or an oxide semiconductor;
    a plurality of transistors disposed in the plurality of sub-pixels on the substrate;
    a planarization layer disposed on the plurality of transistors;
    a plurality of light emitting elements disposed on the planarization layer in the plurality of sub-pixels; and
    a plurality of light emitting layer protective patterns disposed between the planarization layer and an anode of at least one of the light emitting elements, the light emitting layer protective patterns including photosensitive material.

2. The display device according to claim 1, wherein the light emitting layer protective patterns include a transparent conductive material, the photosensitive material doped in the transparent conductive material.

3. The display device according to claim 1, wherein each of the plurality of light emitting elements includes the anode, a light emitting layer, and a cathode, and a corresponding one of the plurality of light emitting layer protective patterns overlaps with the anode of a corresponding one of the light emitting elements in a same shape.

4. The display device according to claim 1, wherein each of the plurality of sub-pixels includes an emission area and a circuit area where the plurality of transistors are disposed, and
    at least one of the plurality of light emitting layer protective patterns overlaps the emission area but does not overlap the circuit area.

5. The display device according to claim 1, wherein the planarization layer includes a contact hole through which a source electrode of at least one of the plurality of transistors is opened,
    at least one of the plurality of light emitting layer protective patterns is in contact with the source electrode through the contact hole, and
    the anode of one of the plurality of light emitting elements is in contact with a corresponding one of the plurality of light emitting layer protective patterns at the contact hole.

6. The display device according to claim 5, wherein each of the plurality of sub-pixels includes an emission area and a circuit area where the plurality of transistors and a storage capacitor are disposed, and
    at least one of the plurality of light emitting layer protective patterns is disposed to overlap the emission area and a part of the circuit area but not to overlap the storage capacitor of the circuit area.

7. The display device according to claim 1, wherein each of the plurality of light emitting elements includes the anode, a light emitting layer, and a cathode, and a lower surface of a corresponding one of the light emitting layer protective patterns is in contact with the planarization layer and an upper surface of a corresponding one of the plurality of light emitting layer protective patterns is in contact with the anode.

8. The display device according to claim 1, wherein the photosensitive material of the plurality of light emitting layer protective patterns absorbs or scatters UV light in a UV light region and has a transmittance of 85% or more in a visible light region.

9. The display device according to claim 1, wherein the photosensitive material includes at least one of zinc oxide-based materials, titanium (Ti)-based materials and barium titanate (BaTiO$_3$)-based materials.

10. The display device according to claim 2, wherein the transparent conductive material includes at least one of niobium pentoxide (NbO$_5$), silver (Ag), antimony (Sb), platinum (Pt), chromium (Cr), vanadium (V) and nickel (Ni).

11. A display device having an active area including a plurality of sub-pixels and a non-active area, the display device comprising:
    a lower substrate made of a transparent conducting oxide or an oxide semiconductor;
    a plurality of transistors disposed in the plurality of sub-pixels on the lower substrate;
    a planarization layer disposed on the plurality of transistors;
    a plurality of light emitting elements disposed on the planarization layer in the plurality of sub-pixels and including an anode, a light emitting layer, and a cathode; and
    a plurality of light emitting layer protective patterns disposed between the planarization layer and the anode.

12. The display device according to claim 11, wherein the plurality of light emitting layer protective patterns and the anode completely overlap each other with the same shape.

13. The display device according to claim 11, wherein each of the plurality of sub-pixels includes an emission area and a circuit area where the plurality of transistors are disposed, and at least one of the plurality of light emitting layer protective patterns overlaps the emission area but does not overlap the circuit area.

14. The display device according to claim 11, wherein the planarization layer includes a contact hole through which a source electrode of at least one of the plurality of transistors is opened, at least one of the plurality of light emitting layer protective patterns is in contact with the source electrode through the contact hole, and the anode is in contact with the plurality of light emitting layer protective patterns at the contact hole.

15. The display device according to claim 14, wherein each of the plurality of sub-pixels includes an emission area and a circuit area where the plurality of transistors and a storage capacitor are disposed, and at least one of the plurality of light emitting layer protective patterns is disposed to overlap the emission area and a part of the circuit area but not to overlap the storage capacitor of the circuit area.

16. The display device according to claim 11, wherein lower surfaces of the plurality of light emitting layer protective patterns are in contact with the planarization layer and upper surfaces of the plurality of light emitting layer protective patterns are in contact with the anode.

17. The display device according to claim 11, wherein the plurality of light emitting layer protective patterns include a transparent conductive pattern and a photosensitive material doped in the transparent conductive pattern.

18. The display device according to claim 17, wherein the photosensitive material of the plurality of light emitting layer protective patterns absorbs or scatters UV light in a UV light region and has a transmittance of 85% or more in a visible light region.

19. The display device according to claim 18, wherein the photosensitive material includes at least one of zinc oxide-based materials, titanium (Ti)-based materials and barium titanate ($BaTiO_3$)-based materials.

20. The display device according to claim 11, wherein the transparent conductive pattern includes at least one of niobium pentoxide ($NbO_5$), silver (Ag), antimony (Sb), platinum (Pt), chromium (Cr), vanadium (V) and nickel (Ni).

* * * * *